US009923032B2

(12) United States Patent
Lee et al.

(10) Patent No.: US 9,923,032 B2
(45) Date of Patent: Mar. 20, 2018

(54) STACKED ORGANIC LIGHT EMITTING DEVICE AND METHOD OF MANUFACTURING THE SAME

(71) Applicant: SAMSUNG DISPLAY CO., LTD., Yongin-si, Gyeonggi-do (KR)

(72) Inventors: Hyesog Lee, Osan-si (KR); Yunseon Do, Hwaseong-si (KR); Byungchoon Yang, Seoul (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 0 days.

(21) Appl. No.: 15/188,128

(22) Filed: Jun. 21, 2016

(65) Prior Publication Data
US 2017/0104035 A1  Apr. 13, 2017

(30) Foreign Application Priority Data
Oct. 8, 2015 (KR) ........................ 10-2015-0141698

(51) Int. Cl.
*H01L 27/32* (2006.01)
*H01L 51/00* (2006.01)
(Continued)

(52) U.S. Cl.
CPC ........ *H01L 27/3211* (2013.01); *H01L 27/322* (2013.01); *H01L 51/0011* (2013.01);
(Continued)

(58) Field of Classification Search
CPC ............... H01L 27/3211; H01L 27/322; H01L 51/0011; H01L 51/0023; H01L 51/5206;
(Continued)

(56) References Cited

U.S. PATENT DOCUMENTS 5,424,560 A * 6/1995 Norman .............. H01L 27/3209
257/103
5,703,436 A   12/1997 Forrest et al.
(Continued)

FOREIGN PATENT DOCUMENTS

EP    1 478 025 A2    3/2004
EP    1603161 A2 * 12/2005  ......... H01L 27/3244
(Continued)

OTHER PUBLICATIONS

European search report dated Feb. 16, 2017.
(Continued)

*Primary Examiner* — Ida M Soward
(74) *Attorney, Agent, or Firm* — Lee & Morse, P.C.

(57) ABSTRACT

An organic light emitting device, an organic light emitting display device, and a method of manufacturing a sub-organic light emitting device, the device including a first sub-organic light emitting device; and a second sub-organic light emitting device on the first sub-organic light emitting device, wherein the first sub-organic light emitting device includes a first lower electrode, a first organic light emitting layer on the first lower electrode, and a first upper electrode on the first organic light emitting layer, and the second sub-organic light emitting device includes a second lower electrode insulated from the first lower electrode, a second organic light emitting layer on the second lower electrode and entirely overlapped with the first organic light emitting layer when viewed in a plan view, and a second upper electrode on the second organic light emitting layer.

22 Claims, 28 Drawing Sheets

(51) Int. Cl.
*H01L 51/52* (2006.01)
*H01L 51/56* (2006.01)
*H01L 51/50* (2006.01)

(52) U.S. Cl.
CPC ...... *H01L 51/0023* (2013.01); *H01L 51/5206* (2013.01); *H01L 51/5221* (2013.01); *H01L 51/5234* (2013.01); *H01L 51/5265* (2013.01); *H01L 51/56* (2013.01); *H01L 51/5012* (2013.01)

(58) Field of Classification Search
CPC ............. H01L 51/5221; H01L 51/5234; H01L 51/5265; H01L 51/56
See application file for complete search history.

(56) References Cited

U.S. PATENT DOCUMENTS

| | | | | |
|---|---|---|---|---|
| 6,214,631 B1* | 4/2001 | Burrows | H01L 27/32 | 438/22 |
| 6,297,516 B1* | 10/2001 | Forrest | H01L 27/3209 | 257/103 |
| 6,365,270 B2* | 4/2002 | Forrest | C09K 11/06 | 257/440 |
| 6,934,309 B2* | 8/2005 | Nishikawa | H01S 5/4025 | 372/34 |
| 7,327,081 B2* | 2/2008 | Lo | H01L 51/5271 | 313/504 |
| 7,667,388 B2* | 2/2010 | Ryu | H01L 51/5265 | 313/504 |
| 7,732,803 B2* | 6/2010 | Shum | H01L 27/15 | 257/13 |
| 7,745,986 B2* | 6/2010 | Ito | G02F 1/133555 | 313/504 |
| 7,977,688 B2* | 7/2011 | Kim | H01L 25/0756 | 257/88 |
| 8,436,346 B2* | 5/2013 | Ushikubo | H01L 51/5036 | 257/40 |
| 9,065,079 B2* | 6/2015 | Liu | G09G 3/30 | |
| 9,172,058 B2* | 10/2015 | Lee | H01L 27/3211 | |
| 9,577,220 B2* | 2/2017 | Naijo | H01L 51/5259 | |
| 2003/0213967 A1* | 11/2003 | Forrest | C09K 11/06 | 257/96 |
| 2006/0261731 A1* | 11/2006 | Aziz | H01L 27/3209 | 313/504 |
| 2007/0001588 A1 | 1/2007 | Boroson et al. | | |
| 2007/0029941 A1 | 2/2007 | Ito et al. | | |
| 2008/0001166 A1 | 1/2008 | Lee et al. | | |
| 2008/0258609 A1* | 10/2008 | Nakamura | H01L 51/5265 | 313/504 |
| 2009/0009101 A1* | 1/2009 | Kang | H01L 27/3209 | 315/250 |
| 2010/0193778 A1* | 8/2010 | An | H01L 25/048 | 257/40 |
| 2011/0159252 A1 | 6/2011 | Ober et al. | | |
| 2011/0248249 A1* | 10/2011 | Forrest | H01L 51/5016 | 257/40 |
| 2011/0273082 A1* | 11/2011 | Kim | H01L 25/048 | 313/504 |
| 2011/0279029 A1* | 11/2011 | Hirakata | H01L 25/048 | 313/504 |
| 2013/0200380 A1* | 8/2013 | Chang | H01L 27/3209 | 257/59 |
| 2013/0236999 A1 | 9/2013 | Lee et al. | | |
| 2014/0061621 A1* | 3/2014 | Sung | H01L 51/52 | 257/40 |
| 2014/0127625 A1 | 5/2014 | Defranco et al. | | |
| 2014/0284633 A1* | 9/2014 | Tsay | H01L 25/0756 | 257/88 |
| 2014/0322850 A1 | 10/2014 | Lee et al. | | |
| 2016/0260791 A1* | 9/2016 | Fleissner | H01L 27/3213 | |
| 2016/0315283 A1* | 10/2016 | Kim | H01L 27/3246 | |

FOREIGN PATENT DOCUMENTS

| | | | | |
|---|---|---|---|---|
| KR | 10-2005-0027465 A | | 3/2005 | |
| KR | 10-2007-0067769 A | | 6/2007 | |
| KR | 10-2008-0061766 A | | 3/2008 | |
| KR | 20100008937 A | * | 1/2010 | ........... H01L 25/048 |

OTHER PUBLICATIONS

Krotkus, et al., "Photo-Patterning of Highly Efficient State-of-the-Art Phosphorescent OLEDs Using Orthogonal Hydrofluoroethers" Advanced Optical Materials, 2014, 2, 1043-1048.

* cited by examiner

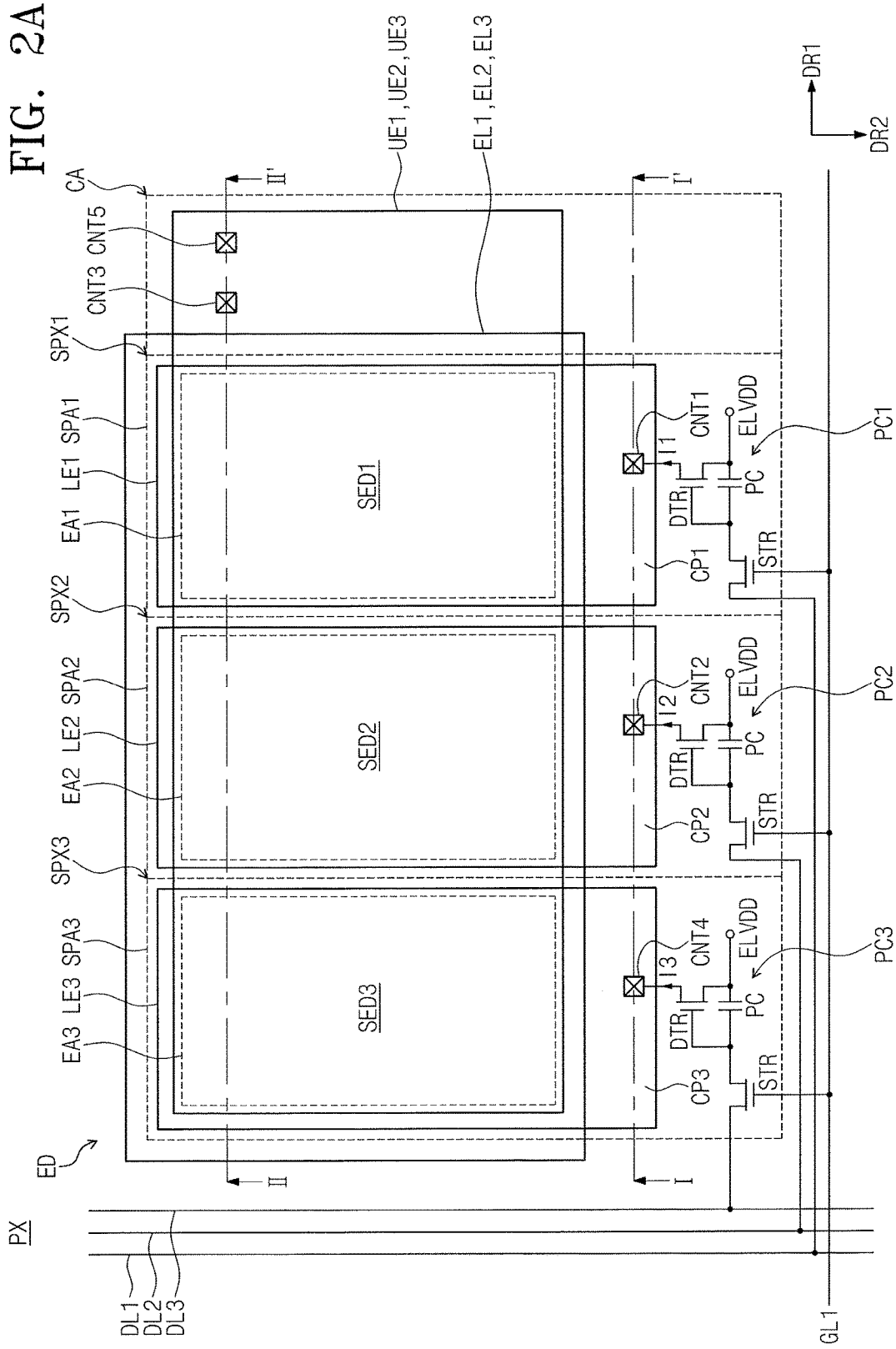

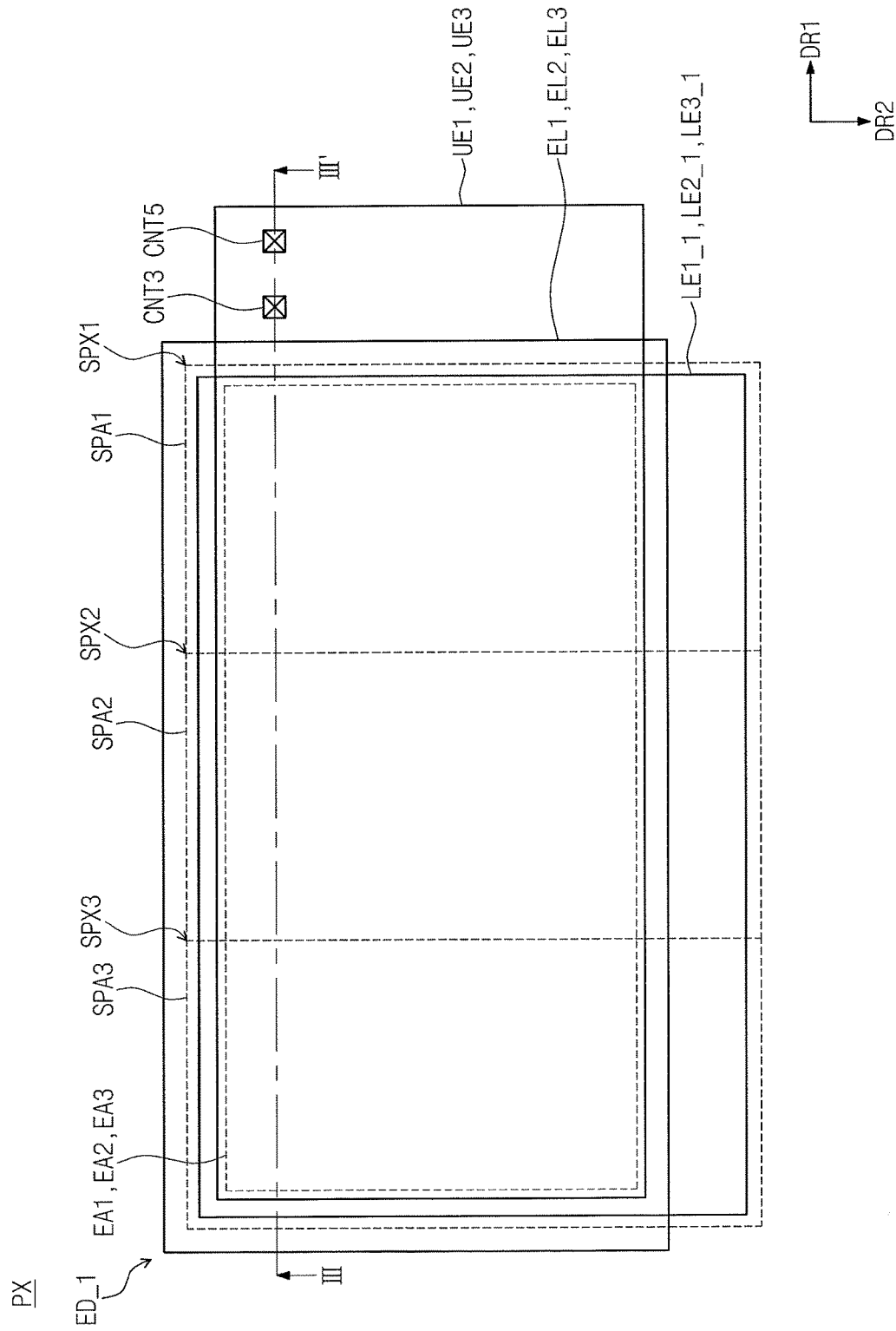

STACKED ORGANIC LIGHT EMITTING DEVICE AND METHOD OF MANUFACTURING THE SAME

CROSS-REFERENCE TO RELATED APPLICATION

Korean Patent Application No. 10-2015-0141698, filed on Oct. 8, 2015, in the Korean Intellectual Property Office, and entitled: "Organic Light Emitting Device, Organic Light Emitting Display Device Having the Same, and Method of Manufacturing the Same," is incorporated by reference herein in its entirety.

BACKGROUND

1. Field

Embodiments relate to an organic light emitting device, an organic light emitting display device having the same, and a method of manufacturing the same.

2. Description of the Related Art

An organic light emitting diode, which is a self-emissive device, has advantages, such as a wide viewing angle, a superior contrast, a fast response time, a high brightness, a low driving voltage, etc.

In general, the organic light emitting diode includes an anode, a hole transport layer, a light emitting layer, an electron transport layer, and a cathode. The hole transport layer, the light emitting layer, and the electron transport layer are sequentially stacked on the anode and are organic thin layers, each including an organic compound.

When voltages different from each other are respectively applied to the anode the cathode, holes injected from the anode move to the light emitting layer through the hole transport layer and electrons injected from the cathode move to the light emitting layer through the electron transport layer. The electrons are recombined with the holes in the light emitting layer to generate excitons, and the organic light emitting device emits the light by the excitons that return to a ground state from an excited state.

SUMMARY

Embodiments are directed to an organic light emitting device, an organic light emitting display device having the same, and a method of manufacturing the same.

The embodiments may be realized by providing an organic light emitting device including a first sub-organic light emitting device; and a second sub-organic light emitting device on the first sub-organic light emitting device, wherein the first sub-organic light emitting device includes a first lower electrode, a first organic light emitting layer on the first lower electrode, and a first upper electrode on the first organic light emitting layer, and the second sub-organic light emitting device includes a second lower electrode insulated from the first lower electrode, a second organic light emitting layer on the second lower electrode and entirely overlapped with the first organic light emitting layer when viewed in a plan view, and a second upper electrode on the second organic light emitting layer.

The second lower electrode is spaced apart from the first lower electrode when viewed in a plan view.

The organic light emitting device further includes an insulating layer between the first and second sub-organic light emitting devices.

The second upper electrode is electrically connected to the first upper electrode.

The second upper electrode is electrically connected to the first upper electrode through a contact hole in the insulating layer.

The first upper electrode is entirely overlapped with the second upper electrode when viewed in a plan view.

The contact hole is spaced apart from the first and second organic light emitting layers when viewed in a plan view.

The insulating layer includes an upper surface that is substantially flat.

The first upper electrode overlaps the first lower electrode in a first light emitting area when viewed in a plan view, the second upper electrode overlaps the second lower electrode in a second light emitting area when viewed in a plan view, and the first light emitting area is spaced apart from the second light emitting area when viewed in a plan view.

A distance between the first lower electrode and the second upper electrode is a first resonance distance, and the first resonance distance is a resonance distance of a light generated by the first organic light emitting layer.

A distance between the second lower electrode and the second upper electrode is a second resonance distance, and the second resonance distance is a resonance distance of a light generated by the second organic light emitting layer.

The first lower electrode and the second lower electrode are each a reflective electrode.

The first upper electrode is a transparent electrode, and the second upper electrode is a semi-transparent electrode.

The organic light emitting device further includes a third sub-organic light emitting device on the second sub-organic light emitting device, wherein the third sub-organic light emitting device includes: a third lower electrode that is insulated from the first lower electrode and the second lower electrode, a third organic light emitting layer on the third lower electrode and entirely overlapped with the second organic light emitting layer when viewed in a plan view, and a third upper electrode on the third organic light emitting layer.

The first organic light emitting layer, the second organic light emitting layer, and the third organic light emitting layer emit lights having different colors from each other.

The first organic light emitting layer emits a red light, the second organic light emitting layer emits a green light, and the third organic light emitting layer emits a blue light.

The first lower electrode and the second lower electrode are entirely overlapped with the first organic light emitting layer when viewed in a plan view.

The first lower electrode and the second lower electrode are each a transparent electrode.

The organic light emitting device further includes a reflective layer between the first lower electrode and a base substrate, the reflective layer being overlapped with the first lower electrode when viewed in a plan view.

The second upper electrode is a transparent electrode or a reflective electrode, a distance between the second upper electrode and the reflective layer is a first resonance distance, and the first resonance distance is a resonance distance of a light generated by the first organic light emitting layer or the second organic light emitting layer.

The organic light emitting device further includes a third sub-organic light emitting device on a same layer as the first sub-organic light emitting device, wherein the third sub-organic light emitting device includes: a third lower electrode insulated from the first lower electrode and the second lower electrode, a third organic light emitting layer on the third lower electrode, and a third upper electrode on the third organic light emitting layer.

The organic light emitting device further includes a fourth sub-organic light emitting device on a same layer as the second sub-organic light emitting device, wherein the fourth sub-organic light emitting device includes: a fourth lower electrode insulated from the first lower electrode, the second lower electrode, and the third lower electrode, a fourth organic light emitting layer on the fourth lower electrode and entirely overlapped with the third organic light emitting layer when viewed in a plan view, and a fourth upper electrode on the fourth organic light emitting layer.

The first lower electrode, the second lower electrode, the third lower electrode, and the fourth lower electrode are spaced apart from each other when viewed in a plan view.

The first sub-organic light emitting device includes a third lower electrode on a same layer as the first lower electrode, and the third lower electrode is spaced apart from the first lower electrode when viewed in a plan view.

The first organic light emitting layer emits a first color light, the second organic light emitting layer emits a second color light, the first color light includes a mixed color obtained by mixing two colors of red, green, and blue colors, and the second color light includes the other one color of the red, green, and blue colors.

The first color light has two peaks respectively corresponding to the two colors or one peak corresponding to the mixed color.

The first sub-organic light emitting device includes a fourth lower electrode on a same layer as the first lower electrode and the third lower electrode, the fourth lower electrode being spaced apart from the first lower electrode and the third lower electrode when viewed in a plan view, and the second sub-organic light emitting device includes a fifth lower electrode on a same layer as the second lower electrode, the fifth lower electrode being entirely overlapped with the fourth lower electrode when viewed in a plan view.

The embodiments may be realized by providing an organic light emitting display device including a base substrate; a driving circuit layer on the base substrate; a base insulating layer on the driving circuit layer; and an organic light emitting device on the base insulating layer, the organic light emitting device including: a first sub-organic light emitting device that includes a first lower electrode, a first organic light emitting layer, and a first upper electrode, which are sequentially stacked on one another; a first insulating layer on the first sub-organic light emitting device; and a second sub-organic light emitting device on the first insulating layer and including a second lower electrode, a second organic light emitting layer, and a second upper electrode, which are sequentially stacked on one another, wherein the second upper electrode is electrically connected to the first upper electrode through a first contact hole in the first insulating layer.

The organic light emitting display device further includes a second insulating layer on the second sub-organic light emitting device; and a third sub-organic light emitting device on the second insulating layer and including a third lower electrode, a third organic light emitting layer, and a third upper electrode, which are sequentially stacked on one another, wherein the third upper electrode is electrically connected to the second upper electrode through a second contact hole in the second insulating layer.

The first contact hole is spaced apart from the second contact hole when viewed in a plan view.

The organic light emitting display device further includes a first pixel, a second pixel, and a connection electrode, wherein: the first pixel and the second pixel each include the first and second sub-organic light emitting devices, and the connection electrode connects the second upper electrode of the first pixel and the second upper electrode of the second pixel.

The organic light emitting display device further includes a second insulating layer between the connection electrode and the second upper electrodes, wherein the connection electrode is connected to the second upper electrodes through second contact holes in the second insulating layer.

The organic light emitting display device further includes a first pixel and a second pixel, wherein: the first pixel and the second pixel each include the first and second sub-organic light emitting devices, and at least one of the first upper electrode and the second upper electrode of the first pixel extends and is connected to a corresponding upper electrode of the first upper electrode and the second upper electrode of the second pixel.

The driving circuit layer includes a first driving transistor and a second driving transistor, the first lower electrode is electrically connected to an electrode of the first driving transistor through the first contact hole in the base insulating layer, and the second lower electrode is electrically connected to an electrode of the second driving transistor through a second contact hole in the base insulating layer.

The driving circuit layer includes a first data line and a second data line, the first driving transistor applies a first light emission current corresponding to a first data voltage provided through the first data line to the first lower electrode, and the second driving transistor applies a second light emission current corresponding to a second data voltage provided through the second data line to the second lower electrode.

The first sub-organic light emitting device includes a third lower electrode spaced apart from the first lower electrode when viewed in a plan view, the third lower electrode being on a same layer as the first lower electrode.

The organic light emitting display device further includes a first color filter on the second sub-organic light emitting device and corresponding to the first lower electrode, and a second color filter on the second sub-organic light emitting device and corresponding to the third lower electrode.

The first organic light emitting layer emits a first color light having a first color, the first color filter transmits a second color and the second color filter transmits a third color, and the first color is a combination of the second color and the third color.

The organic light emitting display device further includes a gray filter on the second sub-organic light emitting device and corresponding to the second lower electrode.

The first sub-organic light emitting device includes a fourth lower electrode on a same layer as the first lower electrode, the fourth lower electrode being spaced apart from the first lower electrode and the third lower electrode when viewed in a plan view, and the second sub-organic light emitting device includes a fifth lower electrode on a same layer as the second lower electrode, the fifth lower electrode being entirely overlapped with the fourth lower electrode when viewed in a plan view.

The organic light emitting display device further includes a gray filter on the second sub-organic light emitting device and corresponding to the fourth lower electrode and the fifth lower electrode.

The first insulating layer includes an upper surface that is substantially flat.

The embodiments may be realized by providing a method of manufacturing a sub-organic light emitting device, the method including forming a first lower electrode; depositing a first organic light emitting material using a first mask including a first opening therethrough such that a first organic light emitting layer is formed corresponding to a first area; forming an insulating layer that covers the first lower electrode and the first organic light emitting layer; forming a second lower electrode on the insulating layer; and depositing a second organic light emitting material using the first mask to form a second organic light emitting layer that corresponds to the first area.

Forming the first lower electrode and forming the second lower electrode each include a patterning process performed by photolithography.

Forming the insulating layer includes depositing an organic thin layer or an inorganic thin layer.

The method further includes depositing a first electrode material using a second mask that includes a second opening therethrough to form a first upper electrode on the first organic light emitting layer; and depositing a second electrode material using the second mask to form a second upper electrode on the second organic light emitting layer.

BRIEF DESCRIPTION OF THE DRAWINGS

Features will be apparent to those of skill in the art by describing in detail exemplary embodiments with reference to the attached drawings in which:

FIG. 2A illustrates a view showing a pixel shown in FIG. 1;

FIG. 4A illustrates a view showing a pixel according to an exemplary embodiment of the present disclosure;

DETAILED DESCRIPTION

Figure 1:
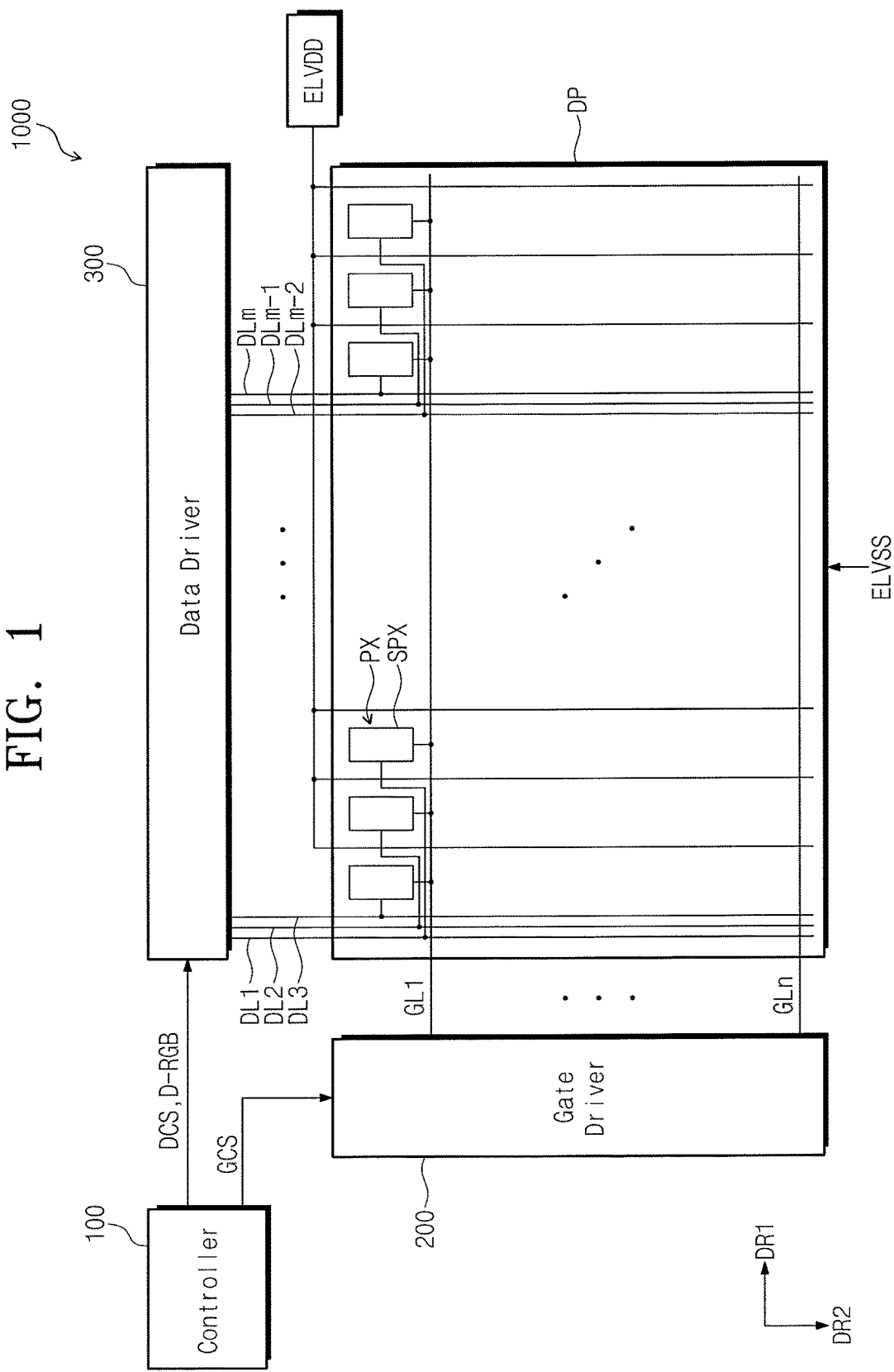
FIG. 1 illustrates a block diagram of an organic light emitting display device according to an exemplary embodiment of the present disclosure.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Further, it will be understood that when an element is referred to as being "under" another element, it can be directly under, and one or more intervening elements may also be present. In addition, it will also be understood that when an element is referred to as being "between" two elements, it can be the only element between the two elements, or one or more intervening elements may also be present. Like reference numerals refer to like elements throughout.

It will be understood that when an element or layer is referred to as being, e.g., "on", "connected to" or "coupled to", another element or layer, it can be directly on, connected or coupled to the other element or layer or intervening elements or layers may be present. In contrast, when an element is referred to as being, e.g., "directly on," "directly connected to" or "directly coupled to", another element or layer, there are no intervening elements or layers present. As used herein, the term "and/or" includes any and all combinations of one or more of the associated listed items and the term "or" is not an exclusive term.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of the present specification.

Spatially relative terms, such as "beneath", "below", "under," "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," "under" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the embodiments will be explained in detail with reference to the accompanying drawings.

FIG. 1 illustrates a block diagram showing an organic light emitting display device 1000 according to an exemplary embodiment of the present disclosure.

Referring to FIG. 1, the organic light emitting display device 1000 may include a controller 100, a gate driver 200, a data driver 300, and a display panel DP.

The controller 100 receives input image signals (not shown) and converts a data format of the input image signals to a data format appropriate to an interface specification and a driving mode of the data driver 300 to generate image data D-RGB. The controller 100 outputs the image data D-RGB and various control signals DCS and GCS.

The gate driver 200 receives a gate control signal GCS from the controller 100. The gate control signal GCS includes a vertical start signal starting an operation of the gate driver 200 and a clock signal determining an output timing of signals. The gate driver 200 generates gate signals in response to the gate control signal GCS and sequentially applies the gate signals to gate lines GL1 to GLn.

In FIG. 1, the gate signals are output from one gate driver 200, but they should not be limited thereto or thereby. In the present exemplary embodiment, the organic light emitting display device 1000 may include a plurality of gate drivers. The gate drivers may output gate signals different from each other.

The data driver 300 receives a data control signal DCS and the image data D-RGB from the controller 100. The data driver 300 converts the image data D-RGB to data voltages and applies the data voltages to data lines DL1 to DLm. The data voltages are analog voltages respectively corresponding to grayscale values of the image data D-RGB.

The display panel DP includes the gate lines GL1 to GLn, the data lines DL1 to DLm, and sub-pixels SPX. The gate lines GL1 to GLn extend in a first direction DR1 and are arranged in a second direction DR2 different from the first direction DR1. The data lines DL1 to DLm are insulated from the gate lines GL1 to GLn while crossing the gate lines GL1 to GLn. The data lines DL1 to DLm extend in the second direction DR2 and are arranged in the first direction DR1. The first and second directions DR1 and DR2 are substantially perpendicular to each other.

The display panel DP according to the present exemplary embodiment may further include lines transmitting signals different from the gate signals and the data voltages or a source voltage to the sub-pixels SPX in accordance with a circuit configuration of the sub-pixels SPX.

Each of the sub-pixels SPX is connected to a corresponding gate line of the gate lines GL1 to GLn and a corresponding data line of the data lines DL1 to DLm. Each of the sub-pixels SPX receives a first voltage ELVDD and a second voltage ELVSS having a voltage level lower than that of the first voltage ELVDD.

The sub-pixels SPX are arranged in a matrix form along the first and second directions DR1 and DR2. Each sub-pixel SPX displays one of three primary colors of red, green, and blue colors. The colors displayed by the sub-pixels SPX should not be limited thereto or thereby, and the sub-pixels SPX may display a second primary color of white, yellow, cyan, and magenta colors in addition to the red, green, and blue colors.

The sub-pixels SPX form the pixel PX. As an example, three sub-pixels SPX form one pixel PX, but the number of the sub-pixels SPX required to form one pixel PX should not be limited to three. That is, one pixel PX may include two, four, or more sub-pixels SPX.

The pixel PX serves as an element to display a unit image and a resolution of the display panel DP is decided by the number of the pixels PX included in the display panel DP. FIG. 1 shows only two pixels PX. To improve the resolution of the display panel DP, the pixel PX and the sub-pixels SPX included in the pixel PX are required to have a small size.

In the case where the display panel DP is applied to a large-size display, e.g., a large-size TV, or a head mount display (HMD), the sub-pixels SPX are perceived by a user and an image display quality is deteriorated. To prevent the sub-pixels SPX from being perceived and the image display quality from being deteriorated, the size of the sub-pixels SPX is required to be reduced and the resolution of the display panel DP is required to be higher than about 2000 ppi. The display panel DP according to the present exemplary embodiment may include the sub-pixels SPX and the pixels, which have the size satisfying the resolution.

Figure 2B:
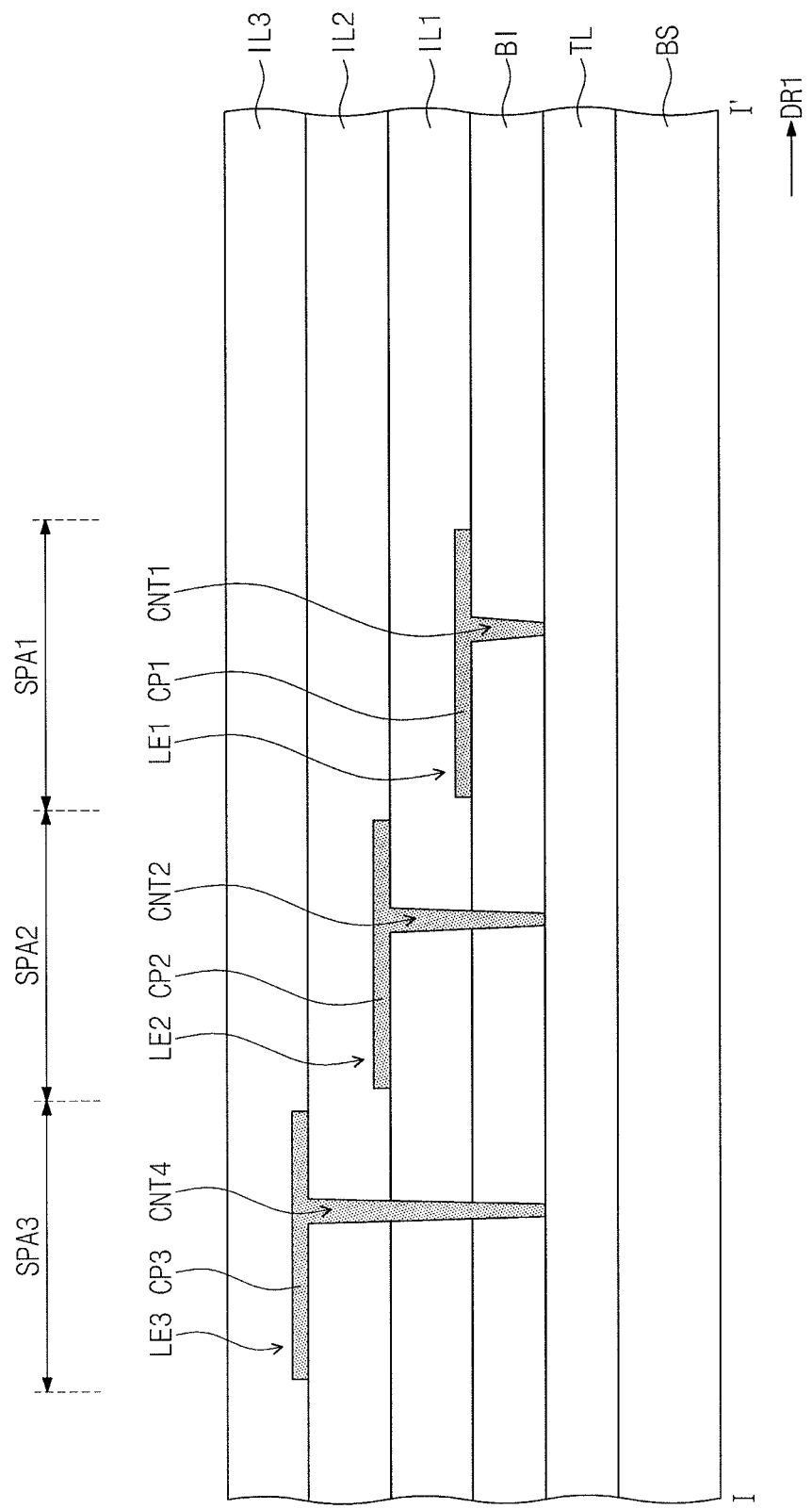
FIG. 2B illustrates a cross-sectional view taken along a line I-I' shown in FIG. 2A.
Figure 2C:
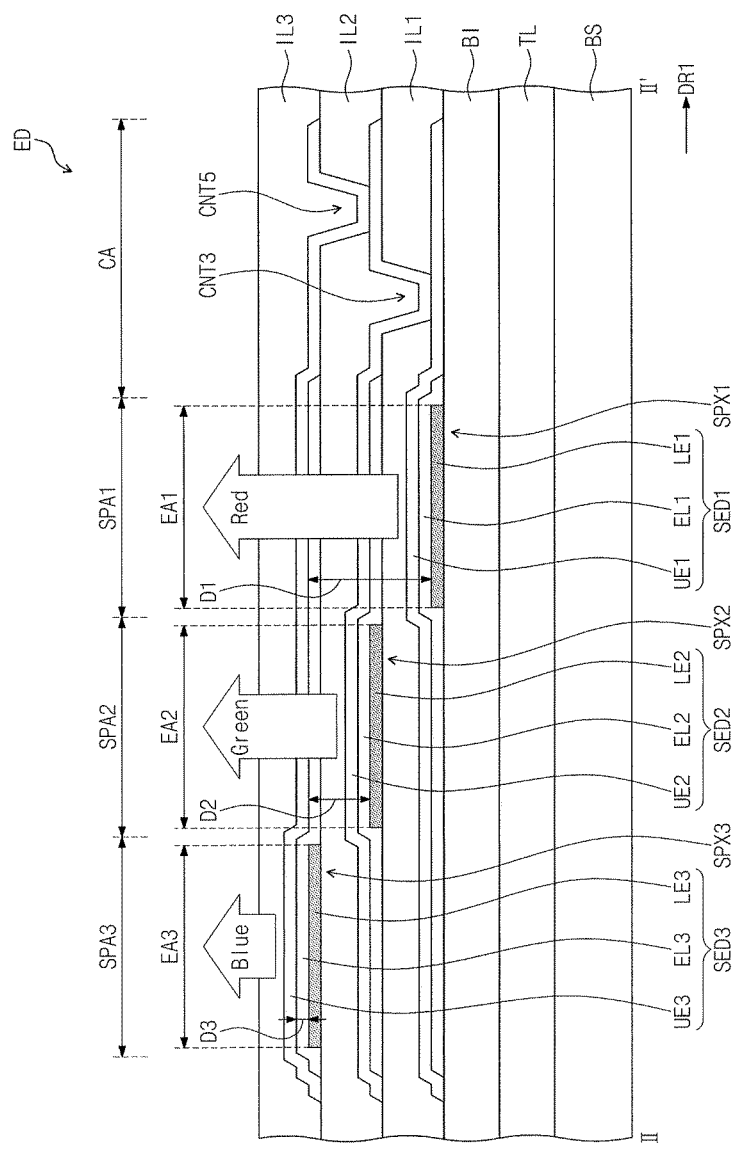
FIG. 2C illustrates a cross-sectional view taken along a line II-II' shown in FIG. 2A.

FIG. 2A illustrates a view showing a pixel shown in FIG. 1, FIG. 2B illustrates a cross-sectional view taken along a line I-I' shown in FIG. 2A, and FIG. 2C illustrates a cross-sectional view taken along a line II-II' shown in FIG. 2A.

Referring to FIGS. 2A to 2C, the pixel PX may include an organic light emitting device ED generating a light and a pixel circuit driving the organic light emitting device ED in response to the data voltage and the gate signal.

The pixel circuit may include a first pixel circuit PC1, a second pixel circuit PC2, and a third pixel circuit PC3. The pixel circuit may be formed on a base substrate BS. The pixel circuit will be described in detail later.

The base substrate BS may be, e.g., a glass substrate. In an implementation, the base substrate BS may be, e.g., a flexible substrate. In this case, the base substrate BS may include a polymer having superior heat resistance, superior durability, and superior flexibility, such as polyethylene terephthalate, polyethylene naphthalate, polycarbonate, polyarylate, polyether imide, polyether sulfone, polyimide, polymethyl methacrylate, etc.

A driving circuit layer TL, on which the pixel circuit is formed, may be on the base substrate BS, and a base insulating layer BI may be on an entire surface of the driving circuit layer TL. The base insulating layer BI may have a single-layer structure or a multi-layer structure of an organic thin layer and/or an inorganic thin layer.

As an example, the organic light emitting device ED may include first, second, and third sub-organic light emitting devices SED1, SED2, and SED3 on the base insulating layer BI and sequentially stacked as shown in FIG. 2C. In an implementation, the organic light emitting device ED may include four or more sub-organic light emitting devices.

In an implementation, each of the first, second, and third sub-pixels SPX1, SPX2, and SPX3 of the pixel PX may include the first to third sub-organic light emitting devices SED1 to SED3.

The first sub-organic light emitting device SED1 may be on the base insulating layer BI. The first sub-organic light emitting device SED1 may include a first lower electrode LE1, a first organic light emitting layer EL1, and a first upper electrode UE1.

The first lower electrode LE1 may be on the base insulating layer BI in or corresponding to a first sub-pixel area SPA1. The first lower electrode LE1 may be electrically connected to a driving transistor DTR of the first pixel circuit PC1 exposed through a first contact hole CNT1 defined at or in the base insulating layer BI.

The first organic light emitting layer EL1 may cover a portion of each of the base insulating layer BI and the first lower electrode LE1 when viewed in a plan view. The first organic light emitting layer EL1 may extend in the first direction DR1 and may overlap, overlie, or be in first to third sub-pixel areas SPA1 to SPA3 when viewed in a plan view. The first to third sub-pixel areas SPA1 to SPA3 may be sequentially defined in the first direction DR1. The first organic light emitting layer EL1 may not overlap with, overlie, or be aligned with a first connection portion CP1 when viewed in a plan view, e.g., may expose the first connection portion CP1.

The first upper electrode UE1 may cover a portion of each of the base insulating layer BI and the first organic light emitting layer EU when viewed in a plan view. The first upper electrode UE1 may extend in the first direction DR1 and may overlap, overlie, or be in the first to third sub-pixel areas SPA1 to SPA3 and an upper electrode contact hole area CA when viewed in a plan view. The upper electrode contact hole area CA may be (e.g., laterally) adjacent to the first sub-pixel area SPA1 in the first direction DR1. The first upper electrode UE1 may not overlap with, overlie, or be aligned with the first connection portion CP1 when viewed in a plan view such that the first upper electrode UE1 may not be directly connected to the first lower electrode LE1.

The organic light emitting device ED may further include a first insulating layer IL1. The first insulating layer IL1 may be on or cover the entire surface of the base insulating layer BI and may cover the first sub-organic light emitting device ED. The first insulating layer IL1 may have a single-layer structure or a multi-layer structure of an organic thin layer and/or an inorganic thin layer. The first insulating layer IL1 may have a substantially flat upper surface. Upper layers disposed above or on the first insulating layer IL1 may be planarized by the upper surface of the first insulating layer IL1.

The second sub-organic light emitting device SED2 may be on the first insulating layer IL1. The second sub-organic light emitting device SED2 may include a second lower electrode LE2, a second organic light emitting layer EL2, and a second upper electrode UE2.

The second lower electrode LE2 may be on the first insulating layer IL1 and may correspond to or be in or aligned with the second sub-pixel area SPA2. The second lower electrode LE2 may be electrically connected to a driving transistor DTR of the second pixel circuit exposed through a second contact hole CNT2 defined at or in the base insulating layer BI and the first insulating layer IL1. The second lower electrode LE2 may be insulated from the first lower electrode LE1. The second lower electrode LE2 may include a second connection portion CP2 overlapped with or overlying and making contact with the second contact hole CNT2.

In the present exemplary embodiment, the second lower electrode LE2 may be spaced apart from the first lower electrode LE1, e.g., without being overlapped or aligned with the first lower electrode LE1 when viewed in a plan view.

The second organic light emitting layer EL2 may cover a portion of each of the first insulating layer IL1 and the second lower electrode LE2 when viewed in a plan view.

The second organic light emitting layer EL2 may extend in the first direction DR1 and may correspond to or be in the first to third sub-pixel areas SPA1 to SPA3 when viewed in a plan view. In an implementation, the second organic light emitting layer EL2 may entirely overlap the first organic light emitting layer EL1 when viewed in a plan view. For example, the expression that a layer entirely overlaps two or more other layers used herein means that the layers are provided to substantially the same area and have the same size. In addition, the expression that a layer entirely overlaps two or more other layers used herein may mean that the layers are partially not overlapped with each other due to an error in a manufacturing process or areas of the two layers, such that greater than about 80% of a total area of the two layers, are overlapped with each other. The second organic light emitting layer EL2 may not overlap or overlie the second connection portion CP2, e.g., exposing the second connection portion CP2.

The second upper electrode UE2 may cover a portion of each of the first insulating layer IL1 and the second organic light emitting layer EL2. The second upper electrode UE2 may extend in the first direction DR1 and may correspond to or be in the first to third sub-pixel areas SPA1 to SPA3 and the upper electrode contact hole area CA. In the present exemplary embodiment, the second upper electrode UE2 may entirely overlap the first upper electrode UE1 when viewed in a plan view.

The second upper electrode UE2 may not overlap the exposed second connection portion CP2 when viewed in a plan view such that the second upper electrode UE2 may not be directly connected to the second lower electrode LE2. In addition, the second upper electrode UE2 may be electrically connected to the first upper electrode UE1 through a third contact hole CNT3 in the first insulating layer IL1. The third contact hole CNT3 may be in the upper electrode contact hole area CA and may expose one end of the first upper electrode UE1 in the upper electrode contact hole area CA. The third contact hole CNT3 may not overlap or be aligned with the first and second organic light emitting layers EU and EL2 when viewed in a plan view.

The organic light emitting device ED may further include a second insulating layer IL2. The second insulating layer IL2 may be on an entire surface of the first insulating layer IL1 and may cover the second sub-organic light emitting device SED2. The second insulating layer IL2 may have a single-layer structure or a multi-layer structure of an organic thin layer and/or an inorganic thin layer. The second insulating layer IL2 may have a substantially flat upper surface. Upper layers on or above the second insulating layer IL2 may be planarized by the upper surface of the second insulating layer IL2.

The third sub-organic light emitting device SED3 may be on the second insulating layer IL2. The third sub-organic light emitting device SED3 may include a third lower electrode LE3, a third organic light emitting layer EL3, and a third upper electrode UE3.

The third lower electrode LE3 may be on the second insulating layer IL2 to correspond to or be in or aligned with the third sub-pixel area SPA3. The third lower electrode LE3 may be electrically connected to a driving transistor DTR of the third pixel circuit through a fourth contact hole CNT4 in the base insulating layer BI and the first and second insulating layers IL1 and IL2. The third lower electrode LE3 may be insulated from the first and lower electrodes LE1 and LE2. The third lower electrode LE3 may include a third connection portion CP3 overlapped with and making contact with the fourth contact hole CNT4.

In the present exemplary embodiment, the third lower electrode LE3 may be spaced apart from the first and second lower electrodes LE1 and LE2, e.g., without being overlapped or aligned with the first and second lower electrodes LE1 and LE2, when viewed in a plan view.

The third organic light emitting layer EL3 may cover a portion of each of the second insulating layer IL2 and the third lower electrode LE3 when viewed in a plan view. The third organic light emitting layer EL3 may extend in the first direction DR1 and may correspond to or be in or aligned with the first to third sub-pixel areas SPA1 to SPA3 when viewed in a plan view. In an implementation, the third organic light emitting layer EL3 may entirely overlap or cover the first and second organic light emitting layers EL1 and EL2 when viewed in a plan view. The third organic light emitting layer EL3 may not overlap or be aligned with the third connection portion CP3, e.g., and may expose the third connection portion CP3.

The third upper electrode UE3 may cover a portion of each of the second insulating layer IL2 and the third organic light emitting layer EL3 and may correspond to or be in the first to third sub-pixel areas SPA1 to SPA3 and the upper electrode contact hole area CA. In the present exemplary embodiment, the third upper electrode UE3 may entirely overlap the first and second upper electrodes UE1 and UE2 when viewed in a plan view.

The third upper electrode UE3 may not overlap the exposed third connection portion CP3 when viewed in a plan view such that the third upper electrode UE3 may not be directly connected to the third lower electrode LE3. The third upper electrode UE3 may be electrically connected to the second upper electrode UE2 through a fifth contact hole CNT5 in the second insulating layer IL2. The fifth contact hole CNT5 may be defined in the upper electrode contact hole area CA and may expose one end of the second upper electrode UE2 in the upper electrode contact hole area CA. The fifth contact hole CNT5 may not overlap the first to third organic light emitting layers EL1 to EL3 when viewed in a plan view.

The organic light emitting device ED may further include a third insulating layer IL3. The third insulating layer IL3 may be on an entire surface of the second insulating layer IL2 and may cover the third sub-organic light emitting device SED3. The third insulating layer IL3 may have a single-layer structure or a multi-layer structure of an organic thin layer and/or an inorganic thin layer. The third insulating layer IL3 may have a substantially flat upper surface. Upper layers disposed on or above the third insulating layer IL3 may be planarized by the upper surface of the third insulating layer IL3.

The first to third upper electrodes UE1 to UE3 (hereinafter, referred to as upper electrodes) may have a variety of layouts. In an implementation, the upper electrodes may have various layouts in the plan view as long as the upper electrodes are disposed such that the upper electrodes are not directly connected to the first to third lower electrodes LE1 to LE3 (hereinafter, referred to as lower electrodes). For instance, the upper electrodes may be formed on the entire surface of the base substrate BS using an open mask.

In an implementation, the organic light emitting device ED may include an optical compensation layer. The optical compensation layer scatters the light emitted from the first to third organic light emitting layers EL1 to EL3 (hereinafter, referred to as organic light emitting layers) to allow the light emitted from the organic light emitting layers to have a wide emission angle or improves a light-extraction efficiency of the organic light emitting device ED.

The upper electrodes and the lower electrodes may be a transparent electrode, a transflective electrode, or a reflective electrode. In addition, the upper electrodes and the lower electrodes may have a single-layer structure of a single material or plural different materials or a multi-layer structure of layers formed of different materials. Further, the upper electrodes and the lower electrodes may be formed by various methods, such as a photolithography or vacuum deposition method, a spin coating method, a cast method, an LB (Langmuir-Blodgett) method, an inkjet printing method, a laser printing method, an LITI (Laser Induced Thermal Imaging) method, etc.

When the upper electrodes and the lower electrodes are the transparent electrode or the transflective electrode, the upper electrodes and the lower electrodes may include Li, Ca, LiF/Ca, LiF/Al, Al, Mg, BaF, Ba, Ag, a compound thereof, or a mixture thereof, e.g., a mixture of Ag and Mg, each which is optically thin, or a transparent metal oxide, e.g., indium tin oxide (ITO), indium zinc oxide (IZO), zinc oxide (ZnO), indium tin zinc oxide (ITZO), Mo, Ti, etc.

When the upper electrodes and the lower electrodes are the reflective electrode, the upper electrodes and the lower electrodes may include Ag, Mg, Cu, Al, Pt, Pd, Au, Ni, Nd, Ir, Cr, Li, Ca, LiF/Ca, LiF/Al, Mo, Ti, a compound thereof, or a mixture thereof, e.g., a mixture of Ag and Mg, each which is optically thick.

As described below, an operation mode and a light efficiency of the organic light emitting device ED may be decided by a combination of the upper and lower electrodes. The upper electrodes may be an anode and the lower electrodes may be a cathode, or the upper electrodes may be the cathode and the lower electrodes may be the anode.

The organic light emitting layers may have a single-layer structure of a single material or plural different materials or a multi-layer structure of layers formed of different materials.

The organic light emitting layers may be formed by various methods, such as a vacuum deposition method, a spin coating method, a cast method, an LB (Langmuir-Blodgett) method, an inkjet printing method, a laser printing method, an LITI (Laser Induced Thermal Imaging) method, etc.

The organic light emitting layers may include materials emitting a red light, a green light, and a blue light and include a fluorescent material or a phosphorescent material. In addition, the organic light emitting layers may include a host and a dopant.

As the host, for example, Alq3(tris(8-hydroxyquinolino) aluminum), CBP(4,4'-bis(N-carbazolyl)-1,1'-biphenyl), PVK(poly(n-vinylcabazole), ADN(9,10-di(naphthalene-2-yl)anthracene), TCTA(4,4',4"-Tris(carbazol-9-yl)-triphenylamine), TPBi(1,3,5-tris(N-phenylbenzimidazole-2-yl) benzene), TBADN(3-tert-butyl-9,10-di(naphth-2-yl) anthracene), DSA(distyrylarylene), CDBP(4,4'-bis(9-carbazolyl)-2,2"-dimethyl-biphenyl), MADN(2-Methyl-9, 10-bis(naphthalen-2-yl)anthracene) may be used, however, it should not be limited thereto or thereby.

When the organic light emitting layers emit the red light, the organic light emitting layers may include a fluorescent material containing PBD:Eu(DBM)3(Phen)(tris(dibenzoylmethanato)phenanthoroline europium) or Perylene. When the organic light emitting layers emit the red light, the dopant included in the organic light emitting layers may be selected from a metal complex, such as PIQIr(acac)(bis(1-phenylisoquinoline)acetylacetonate iridium), PQIr(acac)(bis (1-phenylquinoline)acetylacetonate iridium), PQIr(tris(1- phenylquinoline)iridium), PtOEP(octaethylporphyrin platinum), etc., or organometallic complex.

When the organic light emitting layers emit the green light, the organic light emitting layers may include a fluorescent material containing Alq3(tris(8-hydroxyquinolino) aluminum). When the organic light emitting layers emit the green light, the dopant included in the organic light emitting layers may be selected from a metal complex, such as Ir(ppy)3(fac-tris(2-phenylpyridine)iridium), or organometallic complex.

When the organic light emitting layers emit the blue light, the organic light emitting layers may include a fluorescent material including any one selected from the groups consisting of spiro-DPVBi, spiro-6P, DSB(distyryl-benzene), DSA(distyryl-arylene), PFO(Polyfluorene)-based polymer, and PPV(poly(p-phenylene vinylene)-based polymer. When the light emitting layers emits the blue light, the dopant included in the light emitting layers may be selected from a metal complex, such as (4,6-F2ppy)2Irpic, or organometallic complex.

The organic light emitting layers may emit different lights among the red light, the green light, and the blue light. In an implementation, the organic light emitting layers may emit a color light having the secondary primary color of white, yellow, cyan, and magenta colors. For example, in the case where one organic light emitting layer of the organic light emitting layers emits the white light, a brightness of the organic light emitting device ED may be improved.

In an implementation, a hole transport region or an electron transport region may be disposed between the organic light emitting layers and the upper electrodes or between the organic light emitting layers and the lower electrodes. The hole transport region may include at least one of a hole injection layer, a hole transport layer, a buffer layer, and an electron blocking layer, but it should not be limited thereto or thereby. In addition, the electron transport region may include at least one of a hole blocking layer, an electron transport layer, and an electron injection layer, but it should not be limited thereto or thereby.

In the present exemplary embodiment, the first to third insulating layers IL1 to IL3 may seal the organic light emitting layers. For example, the first to third insulating layers IL1 to IL3 may prevent the organic light emitting layers from being exposed within or after the manufacturing process and protect the organic light emitting layers from foreign substances, e.g., oxygen, moisture, etc. The first to third insulating layers IL1 to IL3 may have a single-layer structure or a multi-layer structure of an organic thin layer and/or an inorganic thin layer.

The first to third pixel circuits PC1 to PC3 are formed on the driving circuit layer TL to respectively correspond to the first to third sub-pixel areas SPA1 to SPA3.

The first pixel circuit PC1 controls the light emission of the first organic light emitting device ED1. For example, the first pixel circuit PC1 is connected to the first data line DL1 and the first gate line GL1 and applies a first light emission current I1 corresponding to the data voltage from the first data line DL1 to the first lower electrode LE1 in response to the gate signal from the first gate line GL1, thereby driving the first sub-organic light emitting device SED1.

In the present exemplary embodiment, the first pixel circuit PC1 includes a switching transistor STR, a pixel capacitor PC, and the driving transistor DTR. A gate electrode of the switching transistor STR is connected to the first gate line GL1 and source and drain/drain and source electrodes of the switching transistor STR are respectively connected to one ends of the first data line DL1 and the pixel capacitor PC. The other end of the pixel capacitor PC receives the first voltage ELVDD. A gate electrode of the driving transistor DTR is connected to the one end of the pixel capacitor PC. Source/drain electrodes of the driving transistor DTR are connected to the other end of the pixel capacitor PC. The drain electrode of the driving transistor DTR is exposed through the first contact hole CNT1 and connected to the first lower electrode LE1 through the first contact hole CNT1.

Semiconductor layers (not shown) of the switching and driving transistors STR and DTR include amorphous silicon, crystalline silicon, or metal oxide semiconductor material, but they should not be limited thereto or thereby. The semiconductor layers of the switching and driving transistors STR and DTR include an organic semiconductor material and one of an n-type semiconductor material and a p-type semiconductor material.

The switching transistor STR receives the gate signal and the data voltage respectively from the first gate line GL1 and the first data line DL1 and applies the data voltage to the one end of the pixel capacitor PC in response to the gate signal. The pixel capacitor PC receives the data voltage and maintains the data voltage. The driving transistor DTR generates the first light emission current I1 in response to the maintained data voltage and applies the first light emission current I1 to the first lower electrode LE1 through the first contact hole CNT1.

The circuit configuration of the first pixel circuit PC1 according to the present exemplary embodiment should not be limited to the above-mentioned embodiment. That is, as an example, the first pixel circuit PC1 may include a circuit configured to include three or more transistors.

As an example, the second and third pixel circuits PC2 and PC3 have the same structure and function as those of the first pixel circuit PC1 except for a connection structure thereof.

In more detail, source and drain electrodes of the switching transistor STR of the second pixel circuit PC2 are connected to a second data line DL2 and the driving transistor DTR of the second pixel circuit PC2 is connected to the second lower electrode LE2 and applies a second light emission current I2 corresponding to the data voltage from the second data line DL2 to the second lower electrode LE2 through the second contact hole CNT2, thereby driving the second sub-organic light emitting device SED2.

Similarly, source and drain electrodes of the switching transistor STR of the third pixel circuit PC3 are connected to a third data line DL3 and the driving transistor DTR of the third pixel circuit PC3 is connected to the third lower electrode LE3 and applies a third light emission current I3 corresponding to the data voltage from the third data line DL3 to the third lower electrode LE3 through the third contact hole CNT3, thereby driving the third sub-organic light emitting device SED3.

The first organic light emitting layer EL1 of the first sub-organic light emitting device SED1 may generate a first light corresponding to the first light emission current I1. For example, a portion of the first organic light emitting layer EL1, which corresponds to the first light emitting area EA1 when viewed in a plan view, generates the first light. The first light emitting area EA1 corresponds to an area in which the first lower electrode LE1 overlaps (e.g., underlies) the first upper electrode UE1 when viewed in a plan view.

Similarly, the second organic light emitting layer EL2 of the second sub-organic light emitting device SED2 may generate a second light corresponding to the second light emission current I2. For example, a portion of the second organic light emitting layer EL2, which corresponds to the second light emitting area EA2 when viewed in a plan view, generates the second light. The second light emitting area EA2 corresponds to an area in which the second lower electrode LE2 overlaps (e.g., underlies) the second upper electrode UE2 when viewed in a plan view.

The third organic light emitting layer EL3 of the third sub-organic light emitting device SED3 may generate a third light corresponding to the third light emission current I3. For example, a portion of the third organic light emitting layer EL3, which corresponds to the third light emitting area EA3 when viewed in a plan view, generates the third light. The third light emitting area EA3 corresponds to an area in which the third lower electrode LE3 overlaps (e.g., underlies) the third upper electrode UE3 when viewed in a plan view.

In an implementation, the first to third light emitting areas EA1 to EA3 may not overlap each other, e.g., may be laterally spaced apart from one another in plan view. In addition, for the convenience of explanation, the first to third light emission areas EA1 to EA3 may have substantially the same width as the first to third lower electrodes LE1 to LE3, respectively, as shown in FIG. 2C, but the first to third light emission areas EA1 to EA3 may have different width from the first to third lower electrodes LE1 to LE3.

In the present exemplary embodiment, the organic light emitting device ED is a front surface light emitting type and the lights generated by the organic light emitting layers travel upward through the upper electrodes. In the above-mentioned arrangement, the lower electrodes are provided as the reflective electrode to reflect the lights generated by the organic light emitting layers to the upward direction, and the upper electrodes are provided as the transparent electrode.

In the present exemplary embodiment, the first, second, third organic light emitting layers EL1 to EL3 emit the red light, the green light, and the blue light, respectively. As described above, the organic light emitting layer emitting the light having a relatively long wavelength may be placed at a relatively low position, and a photoluminescence of the organic light emitting layer placed at a relatively high position, which is caused by the light generated in the lower portion and traveling in the higher portion, may be prevented. For instance, different from the present exemplary embodiment, in the case where the first, second, and third organic light emitting layers EL1, EL2, and EL3 were to emit the blue light, the green light, and the red light, respectively, the second and third organic light emitting layers EL2 and EL3 could be excited by the blue light and may cause the photoluminescence since the blue light generated by the first organic light emitting layer EL1 travels approximately in the front direction, and thus the second and third lights could be difficult to be independently controlled.

In the present exemplary embodiment, the organic light emitting layers may be formed through a deposition process. The deposition process deposits a deposition material using a fine metal mask (FMM), and thus the organic light emitting layer and the upper electrodes may be patterned. However, the resolution of the deposition process may be lower than that of the photolithography process used to form the lower electrodes since defects, e.g., sagging of the FMM, may occur when the deposition process is performed on the large area, and a minimum patterning distance of the deposition process may be smaller than a minimum patterning distance of the photolithography process. For instance, the minimum patterning distance of the deposition process is in a range from about 10 micrometers to about 15 micrometers and the minimum patterning distance of the photolithography process is a few tens of nanometers.

However, according to the present exemplary embodiment, the organic light emitting layers and the upper electrodes may be stacked on one another to overlap each other and provided to overlap with the lower electrodes. Accordingly, the organic light emitting layers formed by the deposition process are not required to become small as the lower electrodes formed by the photolithography process and are formed greater than the lower electrodes. Therefore, the size of the first to third sub-pixels SPX1 to SPX3 may be smaller than the minimum patterning distance of the deposition process when viewed in a plan view, and as a result, the resolution of the display panel DP (refer to FIG. 1) may be improved. For example, when the organic light emitting layers are formed to allow a length of sides of the organic light emitting layers to be equal to the minimum patterning distance of the deposition process, a length of short sides of the first to third sub-pixels SPX1 to SPX3 may be one-third (⅓) of the minimum patterning distance of the deposition process, and thus the resolution of the display panel DP may be improved up to about three times.

In addition, the first to third sub-organic light emitting devices SED1 to SED3 may be independently controlled by the first to third pixel circuits PC1, PC2, and PC3. Thus, the organic light emitting device ED may generate the light having various colors in addition to white and black colors.

As an example, only the first and second upper electrodes UE1 and UE2 may be the transparent electrode and the third upper electrode UE3 may be the transflective electrode. In this case, the lights generated by the organic light emitting layers may be resonated by the lower electrodes and the third upper electrode UE3, and thus the light efficiency of the organic light emitting device ED may be improved.

For example, as shown in FIG. 2C, a distance D1 between the first lower electrode LE1 and the third upper electrode UE3 may be a first resonance distance. The first resonance distance may be a resonance distance of the first light generated by the first organic light emitting layer EL1. The resonance distance of the first light may be a resonance distance of a first-order or more of the first light.

Similarly, a distance D2 between the second lower electrode LE2 and the third upper electrode UE3 may be a second resonance distance. The second resonance distance may be a resonance distance of the second light generated by the second organic light emitting layer EL2. The resonance distance of the second light may be a resonance distance of a first-order or more of the second light. In addition, a distance D3 between the third lower electrode LE3 and the third upper electrode UE3 may be a third resonance distance. The third resonance distance may be a resonance distance of the third light generated by the third organic light emitting layer EL3. The resonance distance of the third light may be a resonance distance of a first-order or more of the third light.

As described above, the first to third insulating layers IL1 to IL3 and the layers of the first to third sub-organic light emitting devices SED1 to SED3 may have thicknesses determined such that the first to third resonance distances D1 to D3 are independently defined between the electrodes.

In FIGS. 1 and 2, the first to third data lines DL1 to DL3 are disposed at a left side of the third sub-pixel SPX3. Accordingly, in the case where the organic light emitting device ED is a rear surface light emitting type, an aperture ratio and a brightness of the pixel PX may be prevented from being degraded due to the first to third data lines DL1 to DL3. In an implementation, the first to third data lines DL1 to DL3 may be disposed to respectively overlap with the first to third sub-pixels SPX1 to SPX3 or disposed respectively adjacent to one sides of the first to third sub-pixels SPX1 to SPX3.

Figure 3A:
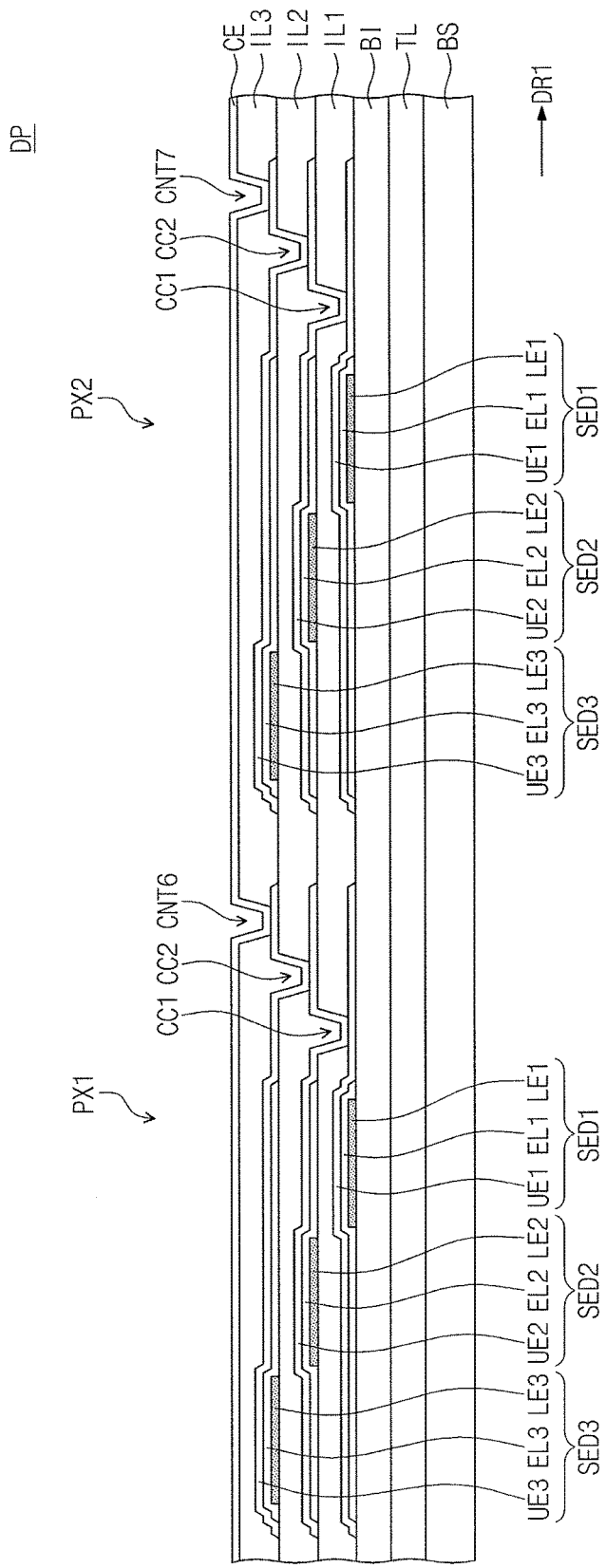
FIGS. 3A and 3B illustrate cross-sectional views showing a cross section of pixels according to an exemplary embodiment of the present disclosure.
Figure 3B:
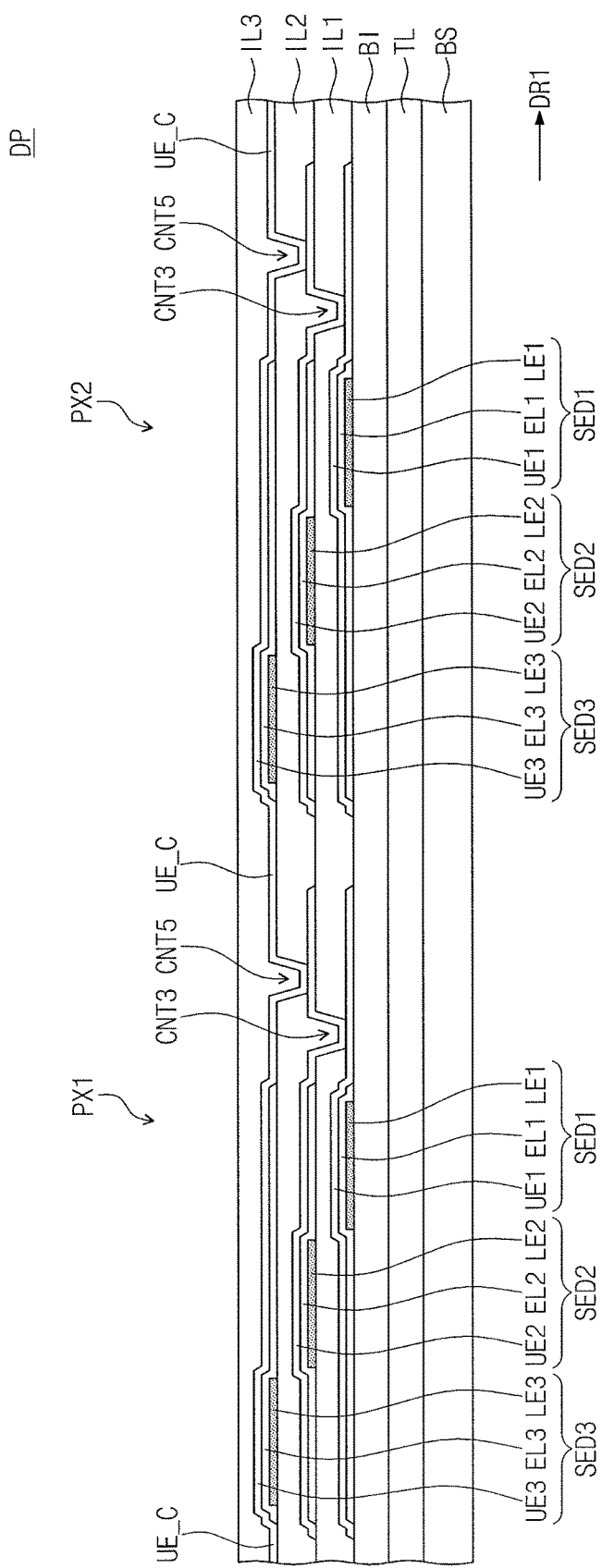

FIGS. 3A and 3B illustrate cross-sectional views showing a cross section of pixels according to an exemplary embodiment of the present disclosure.

FIG. 3A illustrates first and second pixels PX1 and PX2 adjacent to each other in the first direction DR1.

In the present exemplary embodiment, the display panel DP may further include a connection electrode CE formed on an entire area of the third insulating layer IL3.

The connection electrode CE may be connected to one end of the third upper electrode UE3 of the first pixel PX1 through a sixth contact hole CNT6 in the third insulating layer IL3. In addition, the connection electrode CE may be connected to one end of the third upper electrode UE3 of the second pixel PX2 through a seventh contact hole CNT7 in the third insulating layer IL3. Therefore, the third upper electrodes UE3 of the first and second pixels PX1 and PX2 may be connected to each other by the connection electrode CE.

In an implementation, in the connection between the third upper electrodes UE3 of the first and second pixels PX1 and PX2, at least one upper electrode of the first to third upper electrodes UE1 to UE3 of the first and second pixels PX1 and PX2 may extend in the first direction DR1 and may be directly connected to the upper electrode of the pixel adjacent thereto without the connection electrode CE.

As shown in FIG. 3B, among the first to third upper electrodes UE1 to UE3, the third upper electrode UE3 may extend and be connected to the third upper electrode UE3 adjacent thereto. The third upper electrodes UE3 of the first and second pixels PX1 and PX2 may include a connection portion UE_C extending in the first direction DR1 and connected to the adjacent third upper electrode UE3. Due to the connection portion UE_C connecting the third upper electrodes UE3 to each other, all the upper electrodes of the first and second pixels PX1 and PX2 may be electrically connected to each other.

Figure 4B:
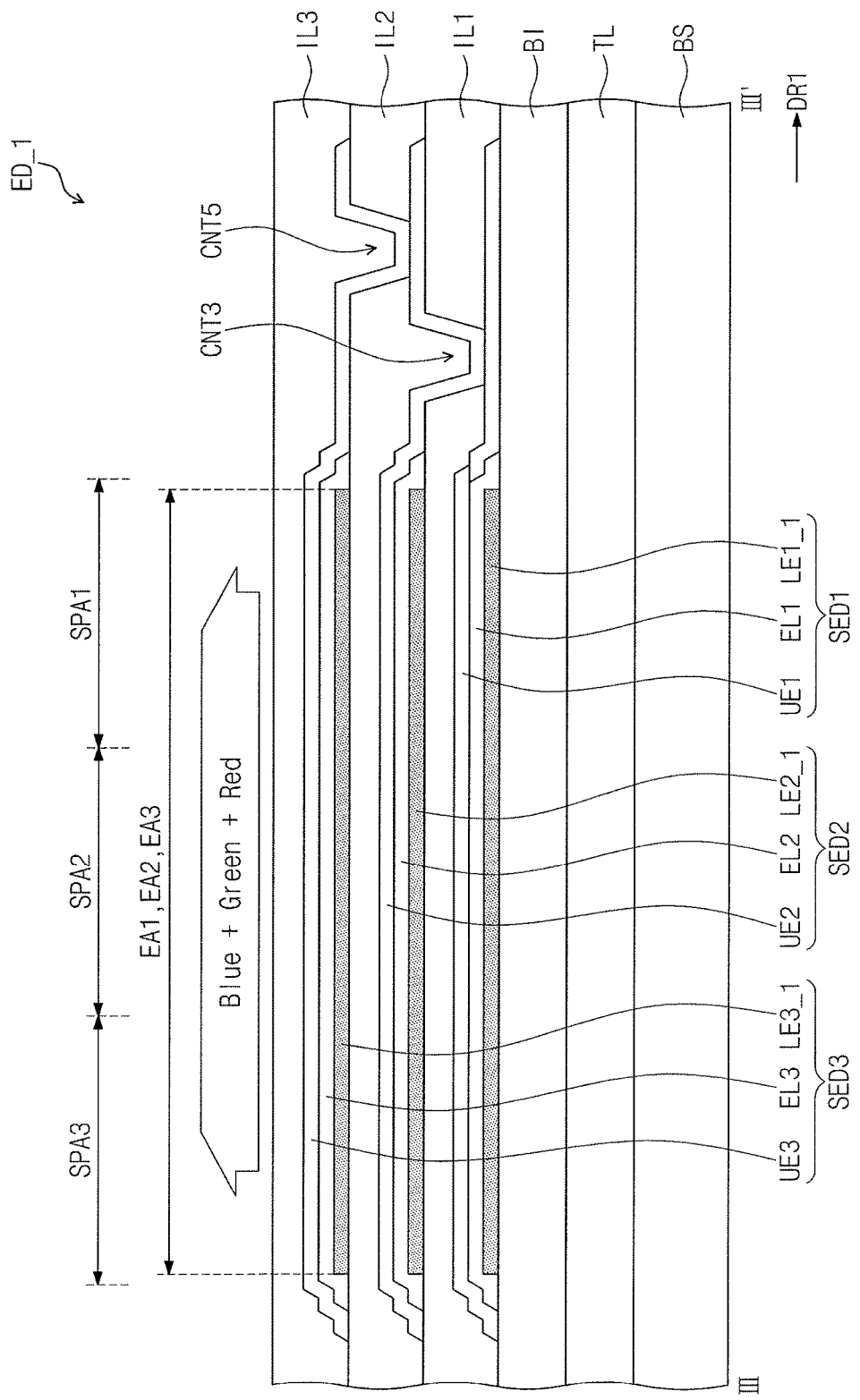
FIG. 4B illustrates a cross-sectional view taken along a line III-III' shown in FIG. 4A.

FIG. 4A illustrates a view showing a pixel according to an exemplary embodiment of the present disclosure and FIG. 4B illustrates a cross-sectional view taken along a line III-III' shown in FIG. 4A.

Referring to FIGS. 4A and 4B, an organic light emitting device ED_1 of the pixel PX shown in FIG. 4A has the same structure and function as those of the organic light emitting device ED of the pixel PX shown in FIG. 2A except that the organic light emitting device ED_1 includes lower electrodes having different shape from that of the organic light emitting device ED.

In the present exemplary embodiment, a first lower electrode LE1_1 may be on the base insulating layer BI to correspond to or in the first to third sub-pixel areas SPA1 to SPA3 and may be provided as the transparent electrode.

In the present exemplary embodiment, a second lower electrode LE2_1 may be on the first insulating layer IL1 to correspond to or in the first to third sub-pixel areas SPA1 to SPA3 and may be provided as the transparent electrode. The second lower electrode LE2_1 may entirely overlap the first lower electrode LE1_1 when viewed in a plan view.

In the present exemplary embodiment, a third lower electrode LE3_1 may be on the second insulating layer IL2 to correspond to or in the first to third sub-pixel areas SPA1 to SPA3 and may be provided as the transparent electrode.

The third lower electrode LE3_1 may entirely overlap the first lower electrode LE1_1 when viewed in a plan view.

In the above-mentioned structure, the organic light emitting layers emit the first to third lights through or at portions corresponding to the first to third sub-pixel areas SPA1 to SPA3. For example, when the first to third light emitting areas EA1 to EA3 extend in the first and second direction DR1 and DR2 such that the first to third light emitting areas EA1 to EA3 overlap or are aligned with each other, the areas from which the first to third lights are emitted may be widened. Thus, the brightness of the organic light emitting device ED_1 may be improved.

In the present exemplary embodiment, the organic light emitting device ED_1 may be the rear surface light emitting type. In this case, the third upper electrode UE3 may be provided as the reflective electrode, and accordingly, the first to third lights are reflected by the third upper electrode UE3 and exit downward through the base substrate BS.

In addition, the organic light emitting device ED_1 may be the front surface light emitting type. In this case, the first lower electrode LE1_1 may be provided as the reflective electrode, and accordingly, the first to third lights are reflected by the first lower electrode LE1_1 and exit upward through the third upper electrode UE3.

Figure 4C:
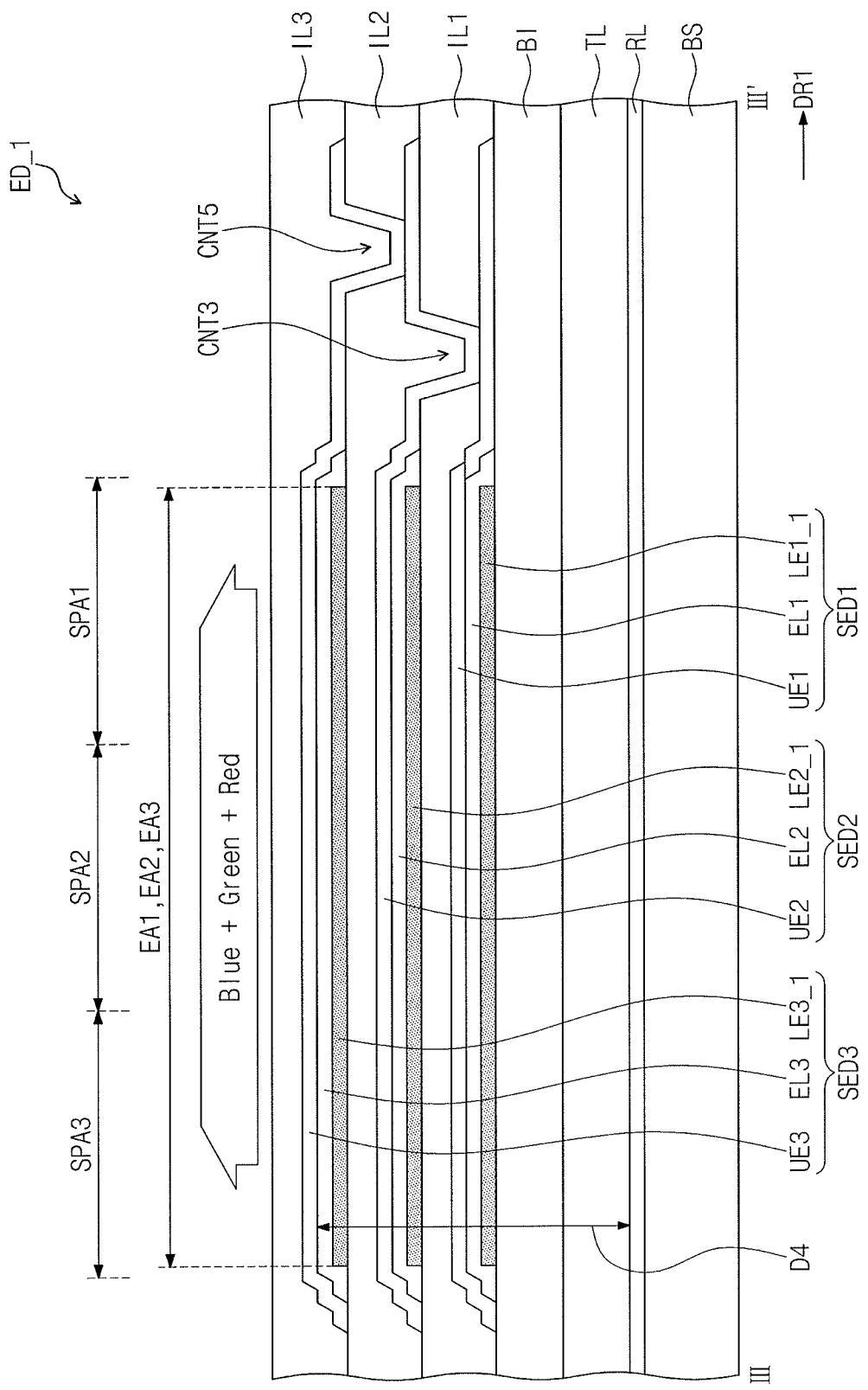
FIG. 4C illustrates a cross-sectional view showing a pixel according to an exemplary embodiment of the present disclosure.

FIG. 4C illustrates a cross-sectional view showing a pixel according to an exemplary embodiment of the present disclosure.

Referring to FIG. 4C, a reflective layer RL may be further disposed under the first lower electrode LE1_1 (e.g., between the base substrate BS and the first lower electrode LE1_1), and the first lower electrode LE1_1 may be provided as the transparent electrode. In this case, the first to third lights are reflected by the reflective electrode RL and exit upwardly through the third upper electrode UE3. In an implementation, the reflective layer RL may be disposed between the driving circuit layer TL and the base substrate BS. For example, the reflective layer RL may be disposed in the driving circuit layer TL, between the first lower electrode LE1_1 and the base insulating layer BI, or between the base insulating layer BI and the driving circuit layer TL.

In the present exemplary embodiment, a distance D4 between the reflective layer RL and at least one upper electrode of the upper electrodes may correspond to at least one resonance distance among the first to third resonance distances. As an example, the distance D4 may be a resonance distance of the organic light emitting layer of the light emitting layers, which has the lowest efficiency. For instance, the third upper electrode UE3 may be the reflective electrode or the transflective electrode.

In the present exemplary embodiment, the first to third lower electrodes LE1_1 to LE3_1 may entirely overlap each other when viewed in a plan view as shown in FIG. 4C. In an implementation, all or a portion of at least one lower electrode among the first to third lower electrodes LE1_1 to LE3_1 may not overlap the other lower electrodes.

Figure 5:
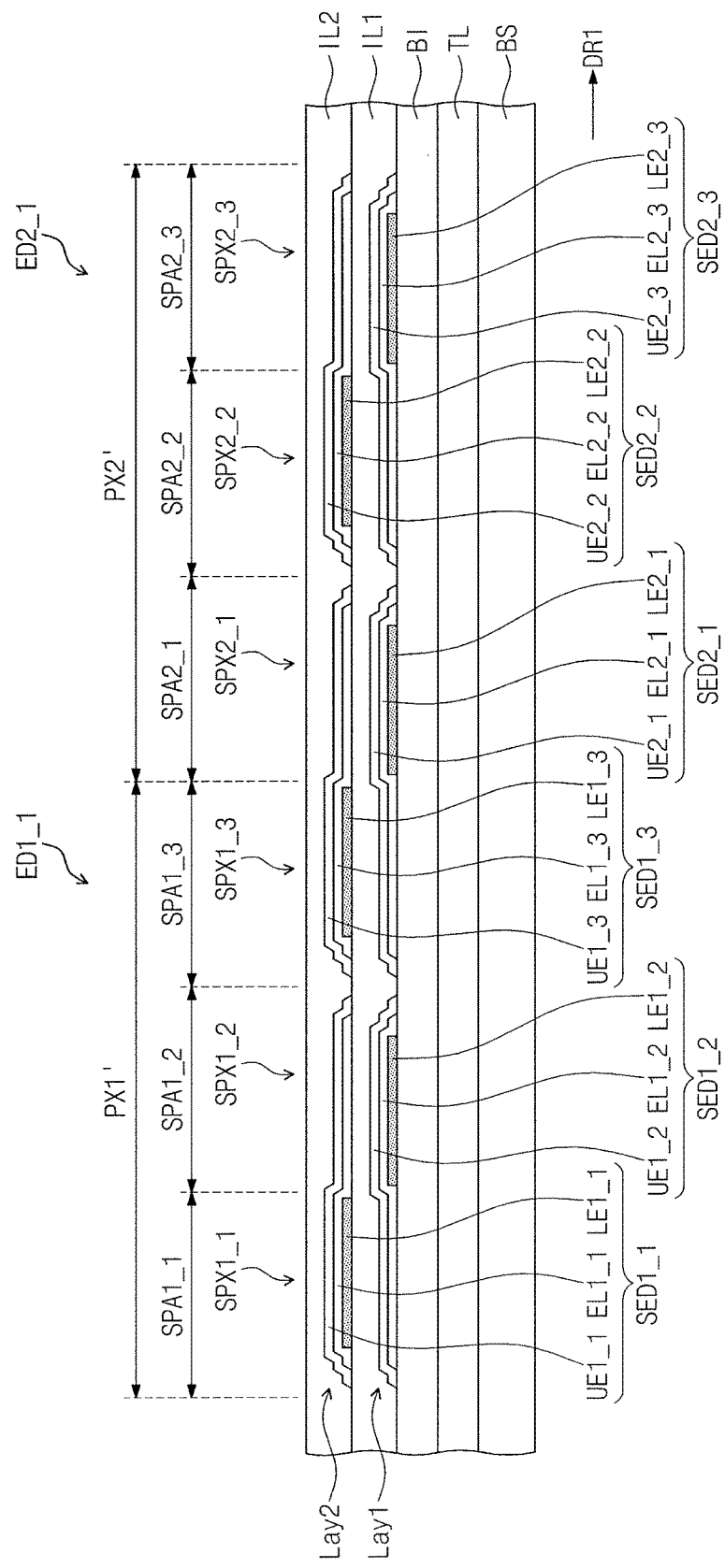
FIG. 5 illustrates a cross-sectional view showing pixels according to an exemplary embodiment of the present disclosure.

FIG. 5 illustrates a cross-sectional view showing pixels according to an exemplary embodiment of the present disclosure.

Referring to FIG. 5, first and second pixels PX1' and PX2' are adjacent to each other in the first direction DR1. Each of the first and second pixels PX1' and PX2' includes first and second organic light emitting devices ED1_1 and ED2_1.

In the present exemplary embodiment, each of the first and second organic light emitting devices ED1_1 and ED2_1 includes three sub-organic light emitting devices stacked into two layers. As an example, each of the first and second organic light emitting devices ED1_1 and ED2_1 may include four or more sub-organic light emitting devices stacked into two layers.

For example, a first_first sub-organic light emitting device SED1_1 and a first_third sub-organic light emitting device SED1_3 may be disposed on a second layer Lay2 of the first organic light emitting device ED1_1 and a first_second sub-organic light emitting device SED1_2 may be disposed on a first layer Lay1 of the first organic light emitting device ED1_1. The first_first to first_third sub-organic light emitting devices SED1_1 to SED1_3 may be sequentially arranged in the first direction DR1 when viewed in a plan view and may be respectively disposed in first to third sub-pixel areas SPA1_1 to SPA1_3 of the first pixel PX1'.

As an example, the first to third sub-pixels SPX1_1 to SPX1_3 of the first pixel PX1' may include the first_first to first_third sub-organic light emitting devices SED1_1 to SED1_3, respectively. The first_first to first_third sub-organic light emitting devices SED1_1 to SED1_3 may emit different lights from each other among the red light, the green light, and the blue light.

Similarly, a second_second sub-organic light emitting device SED2_2 may be disposed on the second layer Lay2 of the second organic light emitting device ED2_1 adjacent to the first organic light emitting device ED1_1 and a second_first sub-organic light emitting device SED2_1 and a second_third sub-organic light emitting device SED2_3 may be disposed on the first layer Lay1 of the second organic light emitting device ED2_1. The second_first to second_third sub-organic light emitting devices SED2_1 to SED2_3 may be sequentially arranged in the first direction DR1 when viewed in a plan view and respectively disposed in first to third sub-pixel areas SPA2_1 to SPA2_3 of the second pixel PX2'.

As an example, the first to third sub-pixels SPX2_1 to SPX2_3 of the second pixel PX2' may include the second_first to second_third sub-organic light emitting devices SED2_1 to SED2_3, respectively. The second_first to second_third sub-organic light emitting devices SED2_1 to SED2_3 emit different lights from each other among the red light, the green light, and the blue light.

The first layer Lay1 and the second layer Lay2 are distinguished from each other with respect to the first insulating layer IL1. For example, a lower portion of the first insulating layer IL1 is referred to as the first layer Lay1 and an upper portion of the first insulating layer IL1 is referred to as the second layer Lay2.

The first and second organic light emitting devices ED1_1 and ED2_1 may have the same structure and function as those of the first to third sub-organic light emitting devices SED1 to SED3 (refer to FIG. 2C), and thus repeated details thereof may be omitted in order to avoid redundancy.

The first_first sub-organic light emitting device SED1_1 may include a first_first upper electrode UE1_1, a first_first organic light emitting layer EU_1, and a first_first lower electrode LE1_1. The first_first lower electrode LE1_1 is disposed in the first sub-pixel area SPA1_1 of the first pixel PX1'. The first_first upper electrode UE1_1 and the first_first organic light emitting layer EL1_1 may be disposed in the first and second sub-pixel areas SPA1_1 and SPA1_2 of the first pixel PX1', respectively, after extending.

The first_second sub-organic light emitting device SED1_2 may include a first_second upper electrode UE1_2, a first_second organic light emitting layer EL1_2, and a first_second lower electrode LE1_2. The first_second lower electrode LE1_2 may not overlap the first_first lower electrode LE1_1 when viewed in a plan view and may be disposed in the second sub-pixel area SPA1_2 of the first pixel PX1'. The first_second upper electrode UE1_2 and the first_second organic light emitting layer EL1_2 may respectively overlap the first_first upper electrode UE1_1 and the first_first organic light emitting layer EL1_1 when viewed in a plan view and disposed in the first and second sub-pixel areas SPA1_1 and SPA1_2 of the first pixel PX1', respectively, after extending.

The first_third sub-organic light emitting device SED1_3 includes a first_third upper electrode UE1_3, a first_third organic light emitting layer EL1_3, and a first_third lower electrode LE1_3. The first_third lower electrode LE1_3 may not overlap the first_first and first_second lower electrodes LE1_1 and LE1_2 when viewed in a plan view and is disposed in the third sub-pixel area SPA1_3. The first_third upper electrode UE1_3 and the first_third organic light emitting layer EL1_3 may not respectively overlap the first_first upper electrode UE1_1 and the first_first organic light emitting layer EL1_1 when viewed in a plan view and may be disposed in the third sub-pixel area SPA1_3 of the first pixel PX1' and the first sub-pixel areas SPA2_1 of the second pixel PX2', respectively, after extending.

The second_first sub-organic light emitting device SED2_1 of the second pixel PX2' includes a second_first upper electrode UE2_1, a second_first organic light emitting layer EL2_1, and a second_first lower electrode LE2_1. The second_first lower electrode LE2_1 is not overlapped with the first_third lower electrode LE1_3 of the first pixel PX1' when viewed in a plan view and is disposed in the first sub-pixel area SPA2_1 of the second pixel PX2'. The second_first upper electrode UE2_1 and the second_first organic light emitting layer EL2_1 may be respectively overlapped with the first_third upper electrode UE3_1 and the first_third organic light emitting layer EL1_3 of the first pixel PX1' and disposed in the third sub-pixel area SPA1_3 of the first pixel PX1' and the first sub-pixel area SPA2_1 of the second pixel PX2', respectively, after extending.

The second_second sub-organic light emitting device SED2_2 includes a second_second upper electrode UE2_2, a second_second organic light emitting layer EL2_2, and a second_second lower electrode LE2_2. The second_second lower electrode LE2_2 is disposed in the second sub-pixel area SPA2_2 of the second pixel PX2'. The second_second upper electrode UE2_2 and the second_second organic light emitting layer EL2_2 are disposed in the second and third sub-pixel areas SPA2_2 and SPA2_3 of the second pixel PX2', respectively, after extending.

The second_third sub-organic light emitting device SED2_3 includes a second_third upper electrode UE2_3, a second_third organic light emitting layer EL2_3, and a second_third lower electrode LE2_3. The second_third lower electrode LE2_3 is not overlapped with the second_second lower electrodes LE2_2 when viewed in a plan view and is disposed in the third sub-pixel area SPA2_3 of the second pixel PX2'. The second_third upper electrode UE2_3 and the second_third organic light emitting layer EL2_3 are respectively overlapped with the second_second upper electrode UE2_2 and the second_second organic light emitting layer EL2_2 when viewed in a plan view and are disposed in the second_second and second_third sub-pixel areas SPA2_2 and SPA2_3 of the second pixel PX2', respectively, after extending.

In the present exemplary embodiment, the organic light emitting layers and the upper electrodes of the first and second pixels PX1' and PX2' may be stacked to overlap each other and may overlap the lower electrodes. Accordingly, the organic light emitting layers formed by the deposition process may not be required to be as small as the size of the lower electrodes formed by the photolithography process and are formed greater than the lower electrodes.

Therefore, the size of the sub-pixels of the first and second pixels PX1' and PX2' in the plan view may be smaller than the minimum patterning distance of the deposition process, and as a result, the resolution of the display panel DP (refer to FIG. 1) may be improved. For example, a length of short sides of each of the sub-pixels of the first and second pixels PX1' and PX2' may be one-half (½) of the minimum patterning distance of the deposition process, and thus the resolution of the display panel DP may be improved up to about two times.

In addition, according to the present exemplary embodiment, three sub-organic light emitting devices displaying different primary colors from each other may be stacked into two layers and included in each of the first and second pixels PX1' and PX2', and a manufacturing cost of the first and second pixels PX1' and PX2' may be reduced compared with that when the three sub-organic light emitting devices are stacked into three layers.

Figure 6A:
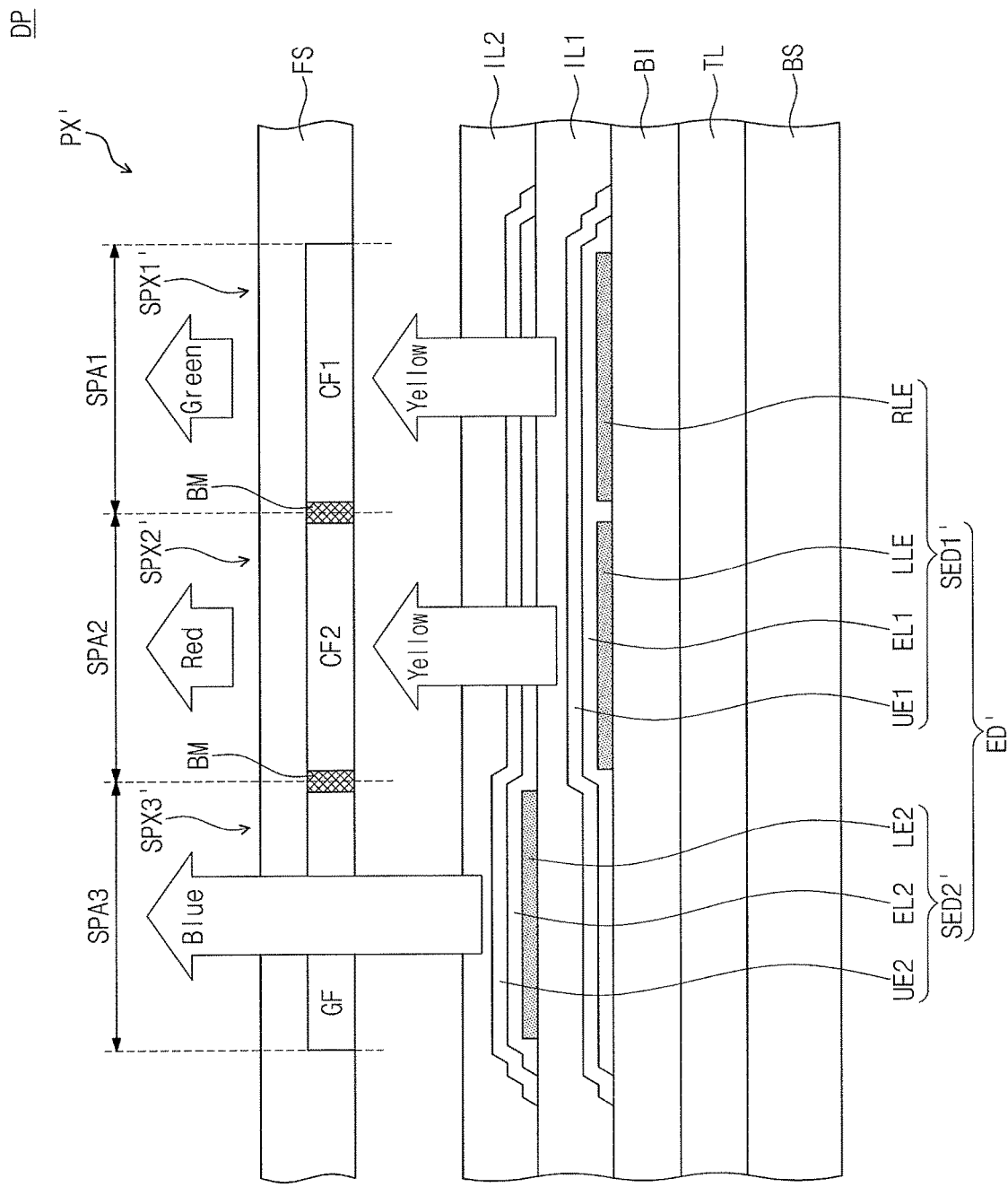
FIGS. 6A and 6B illustrate cross-sectional views showing a pixel according to an exemplary embodiment of the present disclosure.
Figure 6B:
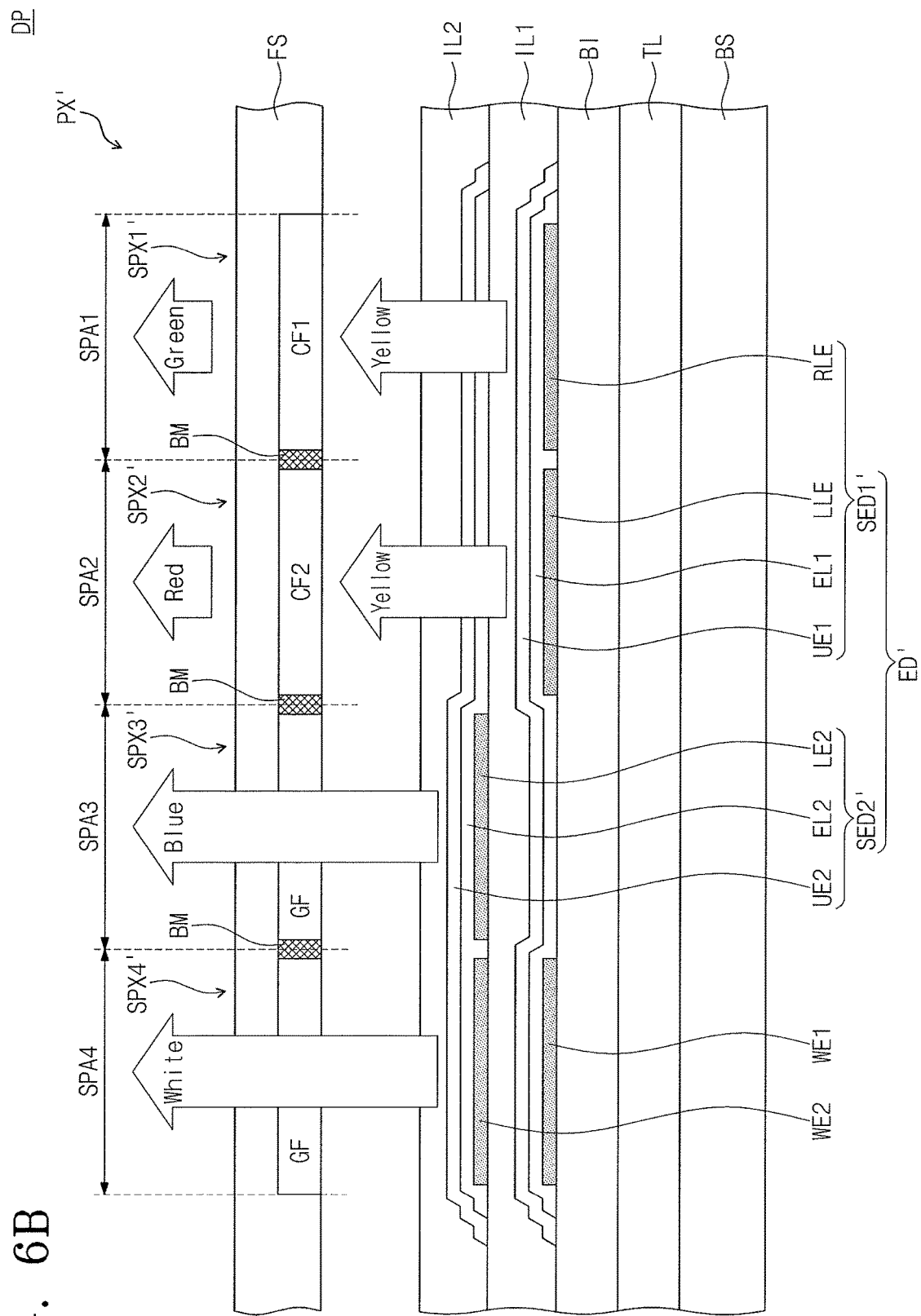

FIGS. 6A and 6B illustrate cross-sectional views showing a pixel PX' according to an exemplary embodiment of the present disclosure.

Referring to FIG. 6A, the pixel PX' may include an organic light emitting device ED'. The organic light emitting device ED' may include first and second sub-organic light emitting devices SED1' and SED2' stacked on one another.

The first sub-organic light emitting device SED1' may include a left lower electrode LLE, a right lower electrode RLE, a first organic light emitting layer EL1, and a first upper electrode UE1.

The right and left lower electrodes RLE and LLE may be on the base insulating layer BI to respectively correspond to or in the first and second sub-pixel areas SPA1 and SPA2.

The first organic light emitting layer EL1 may cover a portion of each of the base insulating layer BI, the right lower electrode RLE, and the left lower electrode LLE and may be disposed to correspond to or in the first to third sub-pixel areas SPA1 to SPA3. The first organic light emitting layer EL1 may emit a mixed or combined light having the second primary color, such as magenta, cyan, etc. For example, the mixed light may be a yellow light having a yellow color obtained from red and green colors. The yellow light may have two (e.g., wavelength) peaks respectively correspond to the red and green colors or one peak corresponding to the yellow color.

The first upper electrode UE1 may cover a portion of the base insulating layer BI and the first organic light emitting layer EU and may be disposed corresponding to or in the first to third sub-pixel areas SPA1 to SPA3.

The first insulating layer IL1 may be disposed on the entire surface of the base insulating layer BI and may cover the first sub-organic light emitting device SED1'.

In the present exemplary embodiment, the display panel DP may further include an opposite substrate FS facing the base substrate BS. The opposite substrate FS may include first and second color filters CF1 and CF2, a gray filter GF, and a black matrix BM.

The first and second color filters CF1 and CF2 and the gray filter GF may be provided in various structures. For example, the first and second color filters CF1 and CF2 and the gray filter GF may be directly formed on the second insulating layer IL2 or formed on a thin film encapsulation layer (TFE) on the second insulating layer IL2.

The first and second color filters CF1 and CF2 may be disposed to respectively correspond to, overlie, or be aligned with the right and left lower electrodes RLE and LLE. The first color filter CF1 may transmit a first color light having a first color and the second color filter CF2 may transmit a second color light having a second color. In an implementation, a mixed or combined color of the first and second colors may be the yellow color. The first and second color may be the green and red colors, respectively.

In addition, the gray filter GF may be disposed to correspond to, overlie, or be aligned with the second lower electrode LE2 of the second sub-organic light emitting device SED2'. The gray filter GF may have a substantially uniform transmittance in a visible light region. Accordingly, a brightness of white light transmitting through the gray filter GF may be reduced and a color coordinate thereof is maintained. In addition, the white light transmitting through the gray filter GF may become a gray light having a gray color.

A first sub-pixel SPX1' of the pixel PX' may include the right lower electrode RLE, the first organic light emitting layer EL1, the first upper electrode UE1, and the first color filter CF1. A second sub-pixel SPX2' of the pixel PX' may include the left lower electrode LLE, the first organic light emitting layer EL1, the first upper electrode UE1, and the second color filter CF2. A third sub-pixel SPX3' of the pixel PX' may include the second sub-organic light emitting device SED2'.

The black matrix BM may be disposed on the same layer as and interposed between the first and second color filters CF1 and CF2. The black matrix BM may include a light blocking material absorbing the light and defines the first to third sub-pixel areas SPA1 to SPA3. In addition, the black matrix BM may help prevent colors of the lights emitted from the first and second sub-pixels SPX1' and SPX2' from being mixed with each other.

The right and left lower electrodes RLE and LLE may be independently operated. In the present exemplary embodiment, the right and left lower electrodes RLE and LLE may be connected to different pixel circuits from each other. When a light emission current is provided through the right lower electrode RLE, the first organic light emitting layer EL1 corresponding to the first sub-pixel area SPA1 emits the yellow light and a green component of the yellow light emitted from the first organic light emitting layer EL1 transmits through the first color CF1. Similarly, when a light emission current is provided through the left lower electrode LLE, the first organic light emitting layer EL1 corresponding to the second sub-pixel area SPA2 emits the yellow light and a red component of the yellow light emitted from the first organic light emitting layer EL1 transmits through the second color CF2.

The third sub-pixel SPX3' of the pixel PX' may include the second sub-organic light emitting device SED2' and the gray filter GF. As an example, the second sub-organic light emitting device SED2' may have the same structure and function as those of the third sub-organic light emitting device SED3 shown in FIG. 2C, and thus details thereof may be omitted in order to avoid redundancy. The second sub-organic light emitting device SED2' emits the blue light. The blue light transmits through the gray filter GF. In an implementation, the gray filter GF may be omitted.

In the present exemplary embodiment, the organic light emitting layers and the upper electrodes of the pixel PX' may be stacked to overlap each other and may overlap the lower electrodes. Accordingly, the organic light emitting layers formed by the deposition process may not be required to be small as the size of the lower electrodes formed by the photolithography process and may be formed greater than the lower electrodes.

Therefore, the size of the first to third sub-pixels SPX1' to SPX3' in the plan view may be smaller than the minimum patterning distance of the deposition process, and as a result, the resolution of the display panel DP (refer to FIG. 1) may be improved. For example, when a length of each side of the organic light emitting layers is equal to the minimum patterning distance of the deposition process, the length of each short side of the sub-pixels of the first to third sub-pixels SPX1' to SPX3' may be one-third (⅓) of the minimum patterning distance of the deposition process, and thus the resolution of the display panel DP may be improved up to about three times.

In addition, according to the present exemplary embodiment, three sub-organic light emitting devices displaying different primary colors from each other may be stacked into two layers and included in the pixel PX', and a manufacturing cost of the pixel PX' may be reduced and a layout in a cross-section of the pixel PX' may be simplified compared with that when the three sub-organic light emitting devices are stacked into three layers.

In an implementation, the pixel PX' may further include a fourth sub-pixel SPX' as shown in FIG. 6B.

In the present exemplary embodiment, the first and second sub-organic light emitting devices SED1' and SED2' may include first and second white lower electrodes WE1 and WE2 of the fourth sub-pixel SPX4'.

The fourth sub-pixel SPX4' of the pixel PX' includes the first and second white lower electrodes WE1 and WE2, the first organic light emitting layer EL1, the first upper electrode UE1, the second organic light emitting layer EL2, and the second upper electrode UE2.

The first white lower electrode WE1 may be disposed on the same layer as the right and left lower electrodes RLE and LLE and the second white lower electrode WE2 is disposed on the same layer as the second lower electrode LE2. In addition, the first and second white lower electrodes WE1 and WE2 may be respectively disposed on the base insulating layer BI and the first insulating layer IL1 to correspond to or in the fourth sub-pixel area SPA4.

The first organic light emitting layer EL1 and the first upper electrode UE1 may further cover the first white lower electrode WE1. In addition, the second organic light emitting layer EL2 and the second upper electrode UE2 may further cover the second white lower electrode WE2.

In the present exemplary embodiment, the gray filter GF may be disposed in the fourth sub-pixel area SPA4 to correspond to, overlie, or be aligned with the first and second white lower electrodes WE1 and WE2.

As an example, the first and second white lower electrodes WE1 and WE2 may be connected to each other. As an example, the first and second white lower electrodes WE1 and WE2 may be connected to the same pixel circuit. When a light emission current is provided through the first and second white lower electrodes WE1 and WE2, the first organic light emitting layer EL1 corresponding to the fourth sub-pixel area SPA4 emits the yellow light and the second organic light emitting layer EL2 corresponding to the fourth sub-pixel area SPA4 emits the blue light. The yellow light is mixed with the blue light in the fourth sub-pixel area SPA4 to generate the white light, and the white light transmits through the gray filter GF of the fourth sub-pixel area SPA4.

The fourth sub-pixel SPX4' may emit the white light, and the brightness of the display panel DP may be improved. In addition, the fourth sub-pixel SPX4' may be formed together with the first to third sub-pixels SPX1' to SPX3' without forming a separate layer or performing an additional process, and thus a manufacturing cost and a manufacturing time may be reduced.

Further, when a length of each side of the organic light emitting layers is equal to the minimum patterning distance of the deposition process, the length of each short side of the first to fourth sub-pixels SPX1' to SPX4' may be one-fourth (¼) of the minimum patterning distance of the deposition process, and thus the resolution of the display panel DP may be improved up to about four times.

Figure 7:
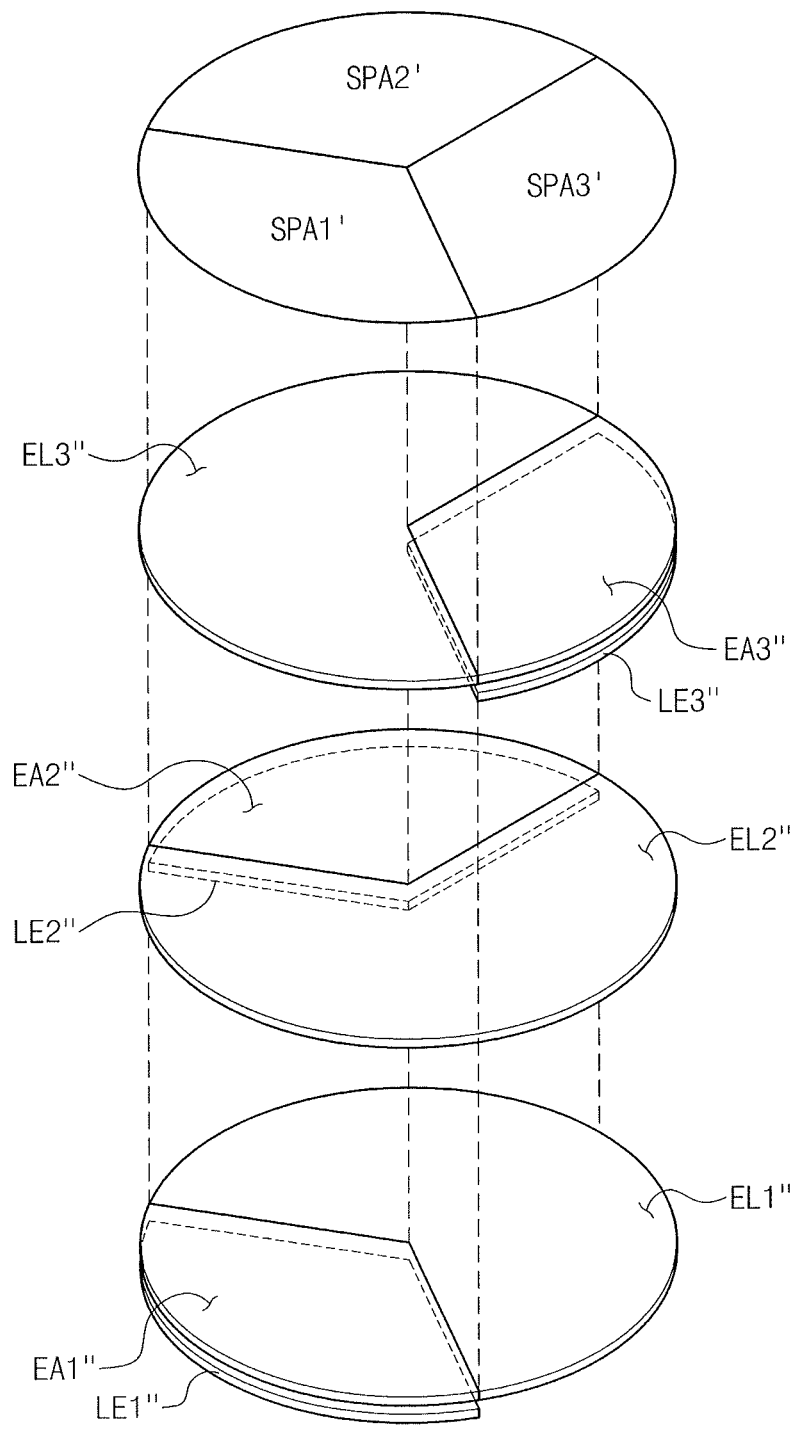
FIG. 7 illustrates a perspective view showing a pixel according to another exemplary embodiment of the present disclosure.

FIG. 7 illustrates a perspective view showing a pixel PX" according to another exemplary embodiment of the present disclosure.

In the present exemplary embodiment, organic light emitting layers and lower electrodes may have various shapes when viewed in a cross section.

In the present exemplary embodiment, the pixel PX" may have a substantially circular shape and each of first to third sub-pixel areas SPA1' to SPA3' of the pixel PX" may have a substantially fan shape obtained by dividing the circular shape into three equal parts. An included angle between the first to third sub-pixel areas SPA1' to SPA3' may be about 120 degrees.

As an example, the pixel PX" may include first to third lower electrodes LE1" to LE3" and first to third organic light emitting layers EL1" to EL3". The first to third lower electrodes LE1" to LE3" may have the same structure and function as those of the first to third lower electrodes LE1 to LE3 shown in FIG. 2C except for the shape when viewed in a plan view, and thus details thereof may be omitted. In addition, the first to third organic light emitting layers EH" to EL3" have the same structure and function as those of the first to third organic light emitting layers EL1 to EL3 shown in FIG. 2C except for the shape when viewed in a plan view, and thus details thereof may be omitted.

Each of the first to third organic light emitting layers EL1" to EL3" may be formed to have a substantially circular shape to correspond to the first to third sub-pixel areas SPA1' to SPA3'. The first to third lower electrodes LE1" to LE3" may have the fan shape to correspond to the first to third sub-pixel areas SPA1' to SPA3', respectively.

In the above-mentioned structure, when the first to third light emission currents are applied to the first to third lower electrodes LE1" to LE3", respectively, the first to third light emitting areas EA1" to EA3" of the first to third organic light emitting layers EL1" to EL3" having the fan shape and respectively corresponding to the first to third sub-pixel areas SPA1' to SPA3' may emit the first to third lights, respectively.

FIGS. 8A to 8E illustrate perspective views showing stages in a method of manufacturing the first sub-organic light emitting device according to an exemplary embodiment of the present disclosure.

Figure 8A:
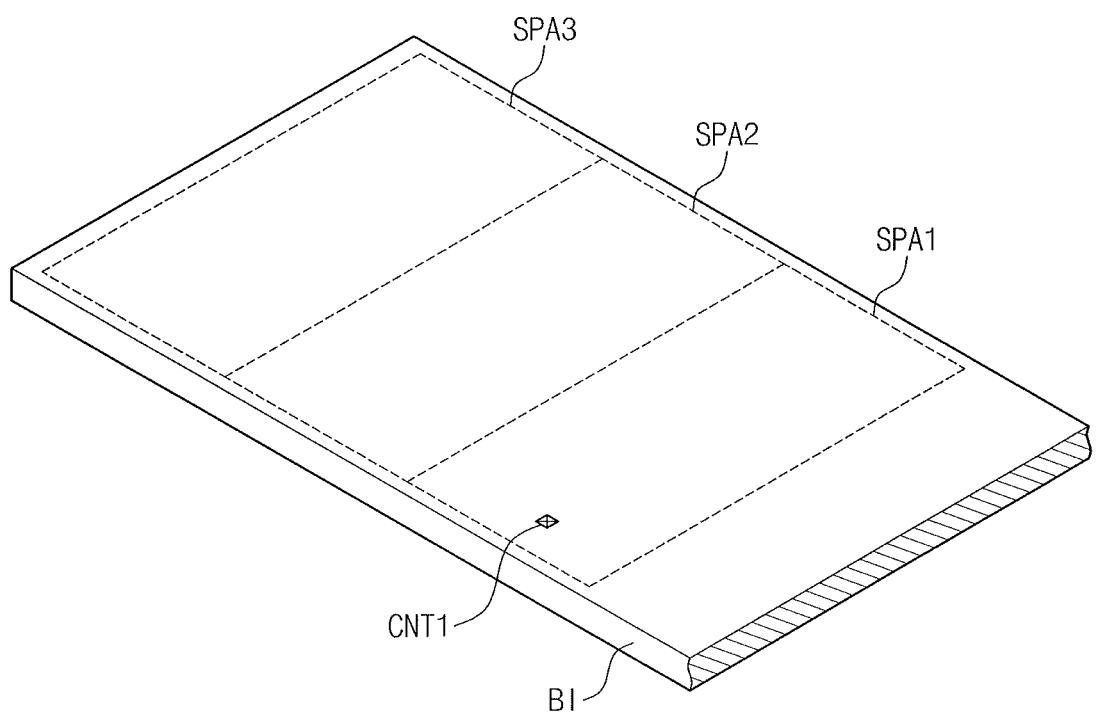
FIGS. 8A to 8E illustrate perspective views showing stages in a method of manufacturing a first sub-organic light emitting device according to an exemplary embodiment of the present disclosure.
Figure 8B:
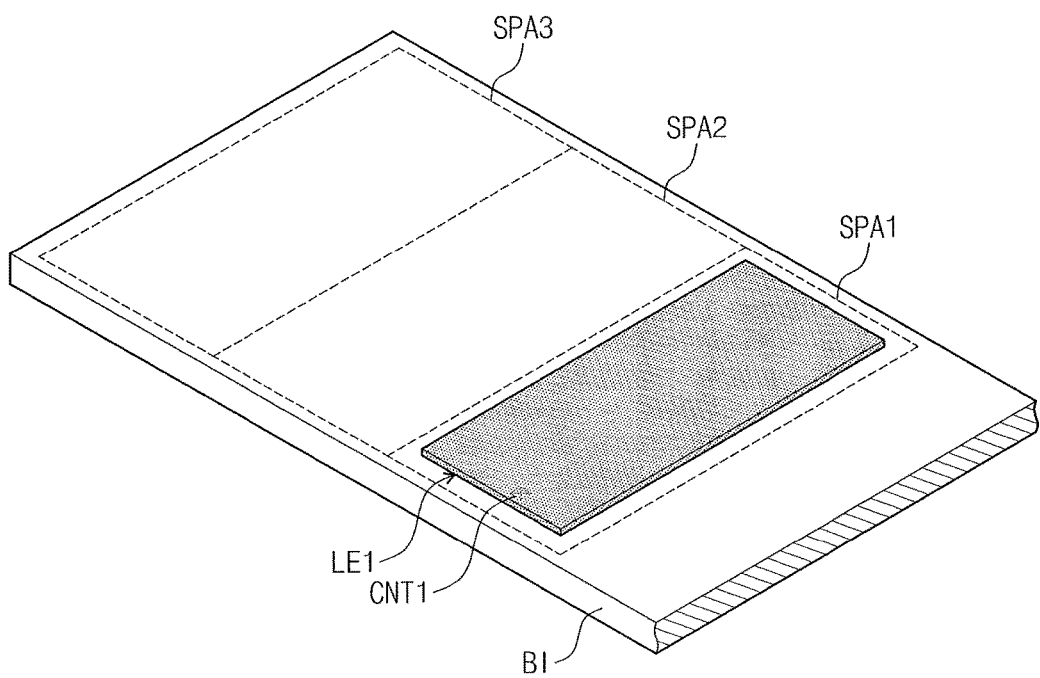

Referring to FIG. 8A, the first contact hole CNT1 may be formed through the base insulating layer BI in the first sub-pixel area SPA1. Then, as shown in FIG. 8B, the first lower electrode LE1 may be formed corresponding to the first sub-pixel area SPA1. The first lower electrode LE1 may be formed by forming a conductive layer on the entire surface of the base insulating layer BI and patterning the conductive layer. The conductive layer may include materials included in the transparent electrode, the transflective electrode, or the reflective material. As an example, the conductive layer may be patterned by the photolithography process.

Figure 8C:
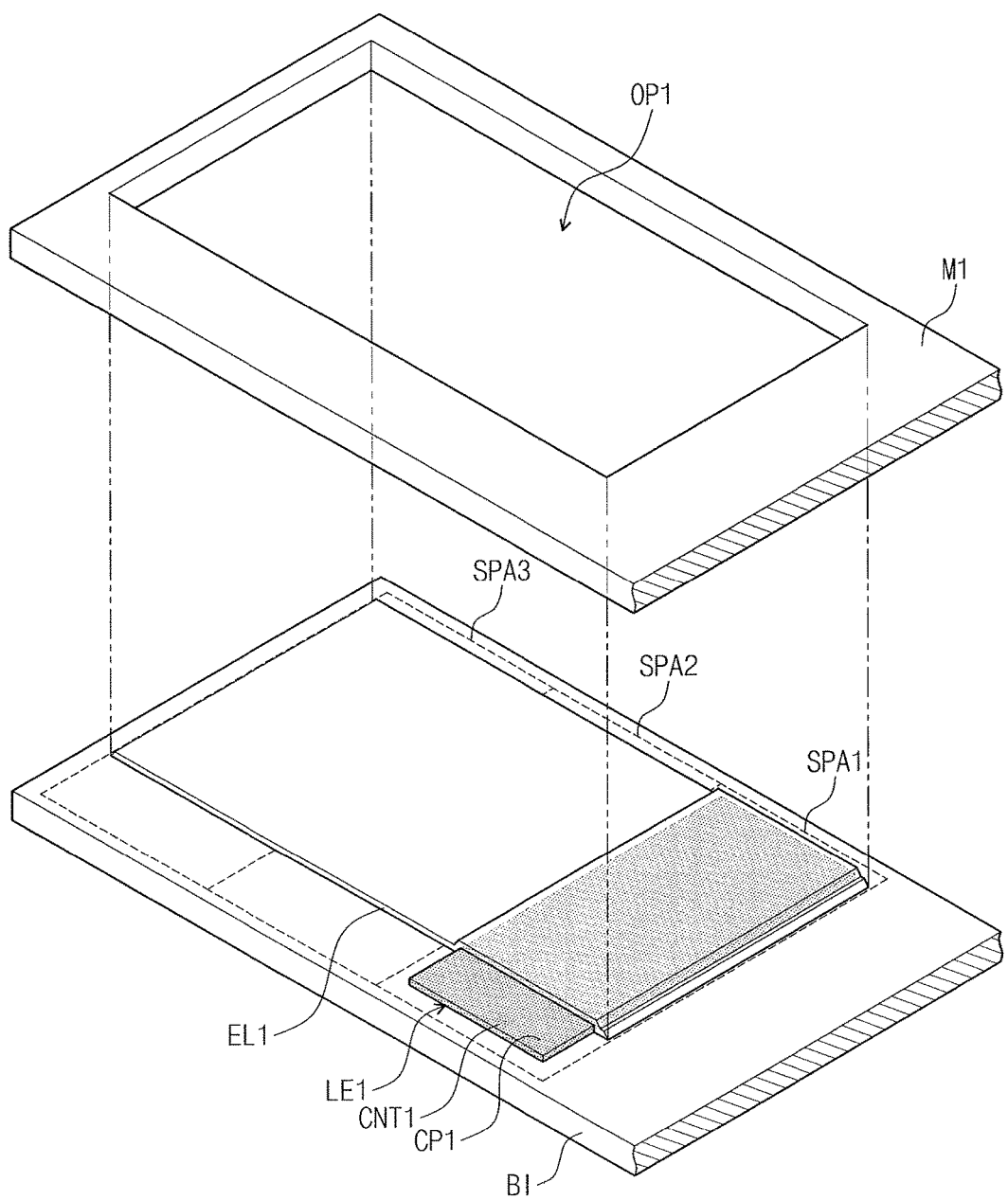

Then, referring to FIG. 8C, the first organic light emitting layer EL1 may be formed to correspond to the first to third sub-pixel areas SPA1 to SPA3. As an example, the first organic light emitting layer EL1 may be formed by the deposition process depositing an organic light emitting material using a first mask M1. For example, the first mask M1 may be the FMM provided with a first opening OP1 formed therethrough to correspond to the first to third sub-pixel areas SPA1 to SPA3. The first organic light emitting layer EL1 may overlap the first lower electrode LE1 in the first sub-pixel area SPA1. The first opening OP1 may not overlap the first connection portion CP1 of the first lower electrode LE1.

Figure 8D:
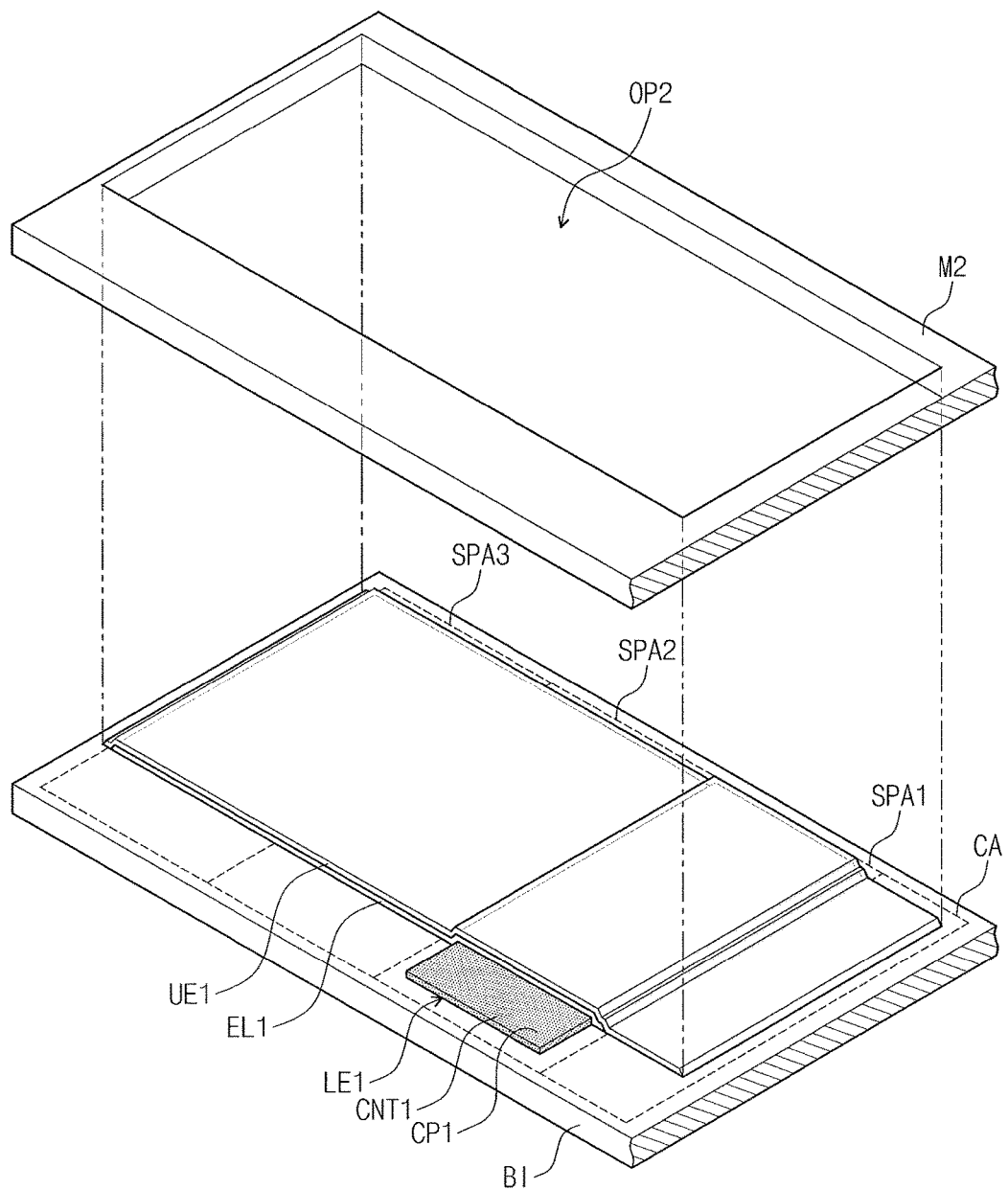

Referring to FIG. 8D, the first upper electrode UE1 may be formed to correspond to the first to third sub-pixel areas SPA1 to SPA3. As an example, the first upper electrode UE1 may be formed by the deposition process depositing an electrode material using a second mask M2. For example, the second mask M2 may be the FMM provided with a second opening OP2 formed therethrough to correspond to the first to third sub-pixel areas SPA1 to SPA3 and the upper electrode contact hole area CA. The second opening OP2 may not overlap the first connection portion CP1 of the first lower electrode LE1.

Figure 8E:
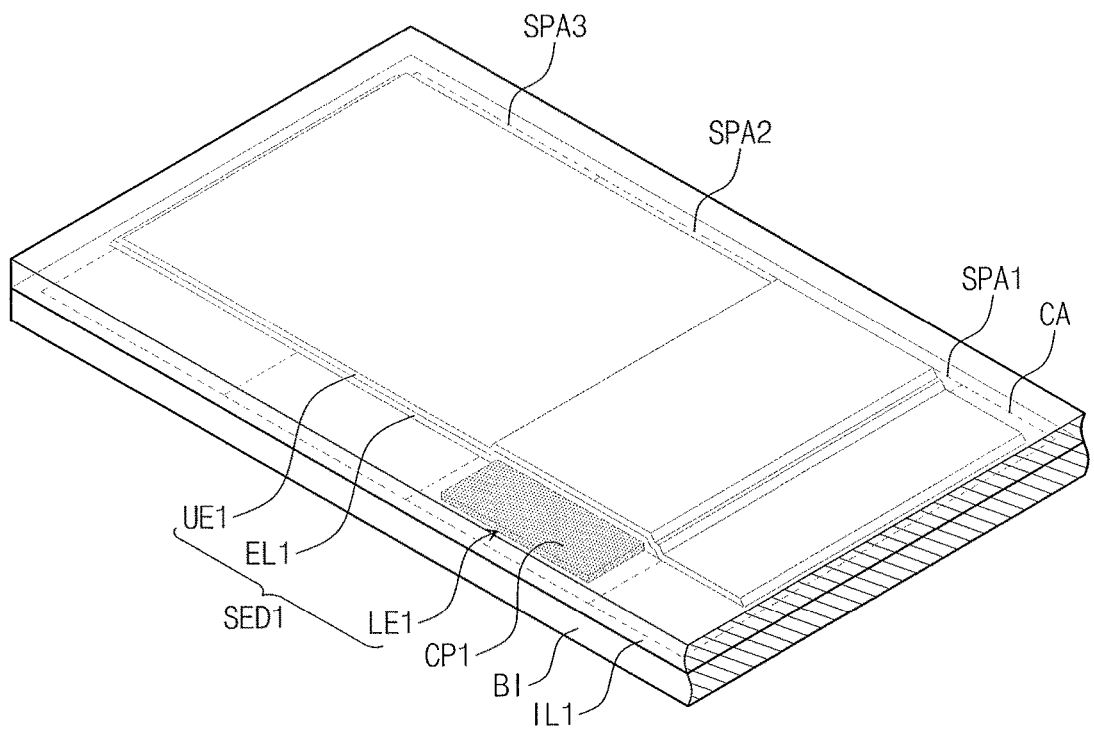

Then, as shown in FIG. 8E, the first insulating layer IL1 may be formed on the entire surface of the base insulating layer BI. The first insulating layer IL1 may cover the first sub-organic light emitting device SED1.

FIGS. 9A to 9E illustrate perspective views showing stages in a method of manufacturing the second sub-organic light emitting device according to an exemplary embodiment of the present disclosure.

Figure 9A:
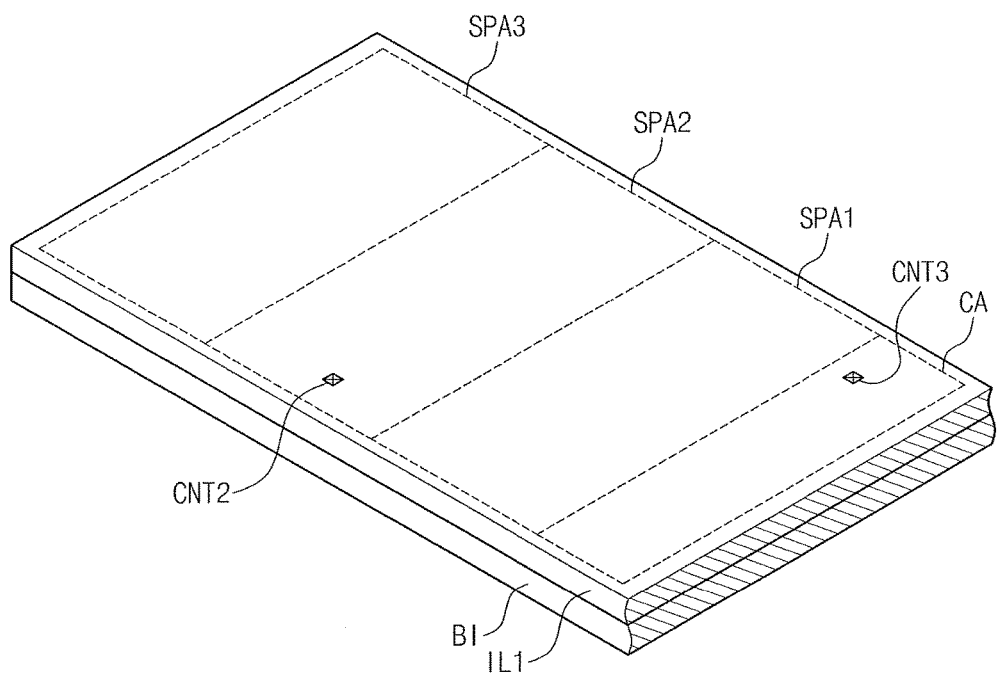
FIGS. 9A to 9E illustrate perspective views showing stages in a method of manufacturing a second sub-organic light emitting device according to an exemplary embodiment of the present disclosure.
Figure 9B:
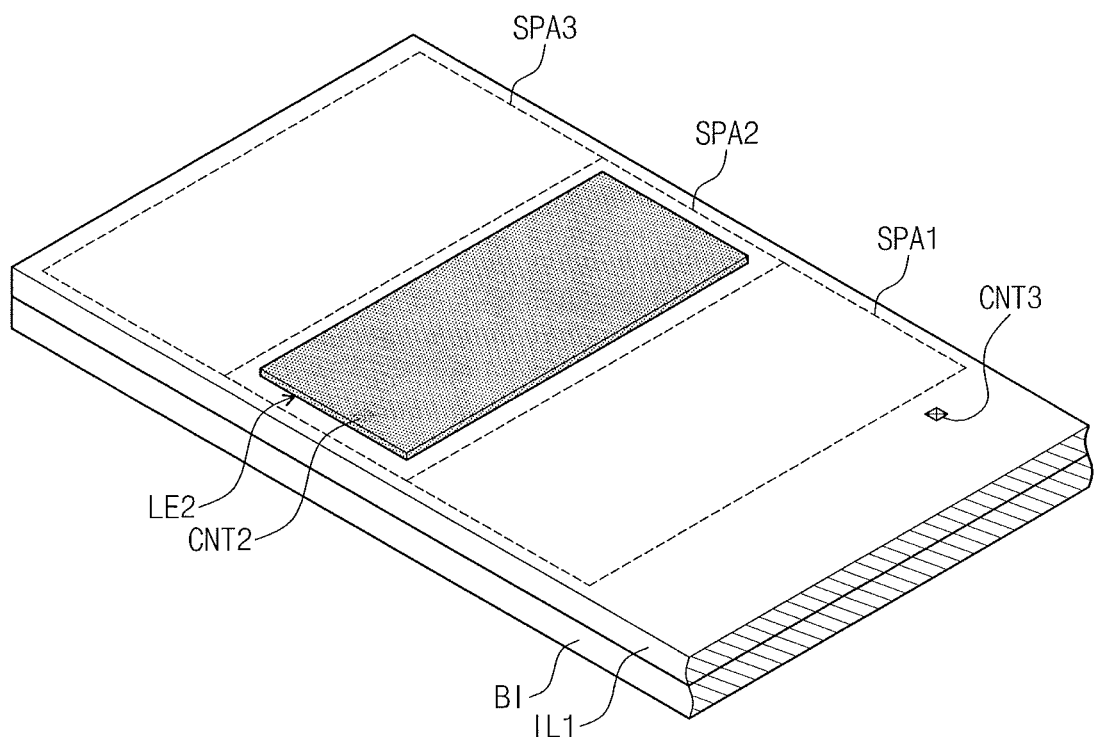

Referring to FIG. 9A, the second contact hole CNT2 may be formed through the base insulating layer BI and the first insulating layer IL1 in the second sub-pixel area SPA2. In addition, the third contact hole CNT3 may be formed in the upper electrode contact hole area CA through the first insulating layer IL1. As shown in FIG. 9B, the second lower electrode LE2 may be formed to correspond to the second sub-pixel area SPA2. The second lower electrode LE2 may be formed through the similar process used to form the first lower electrode LE1.

Figure 9C:
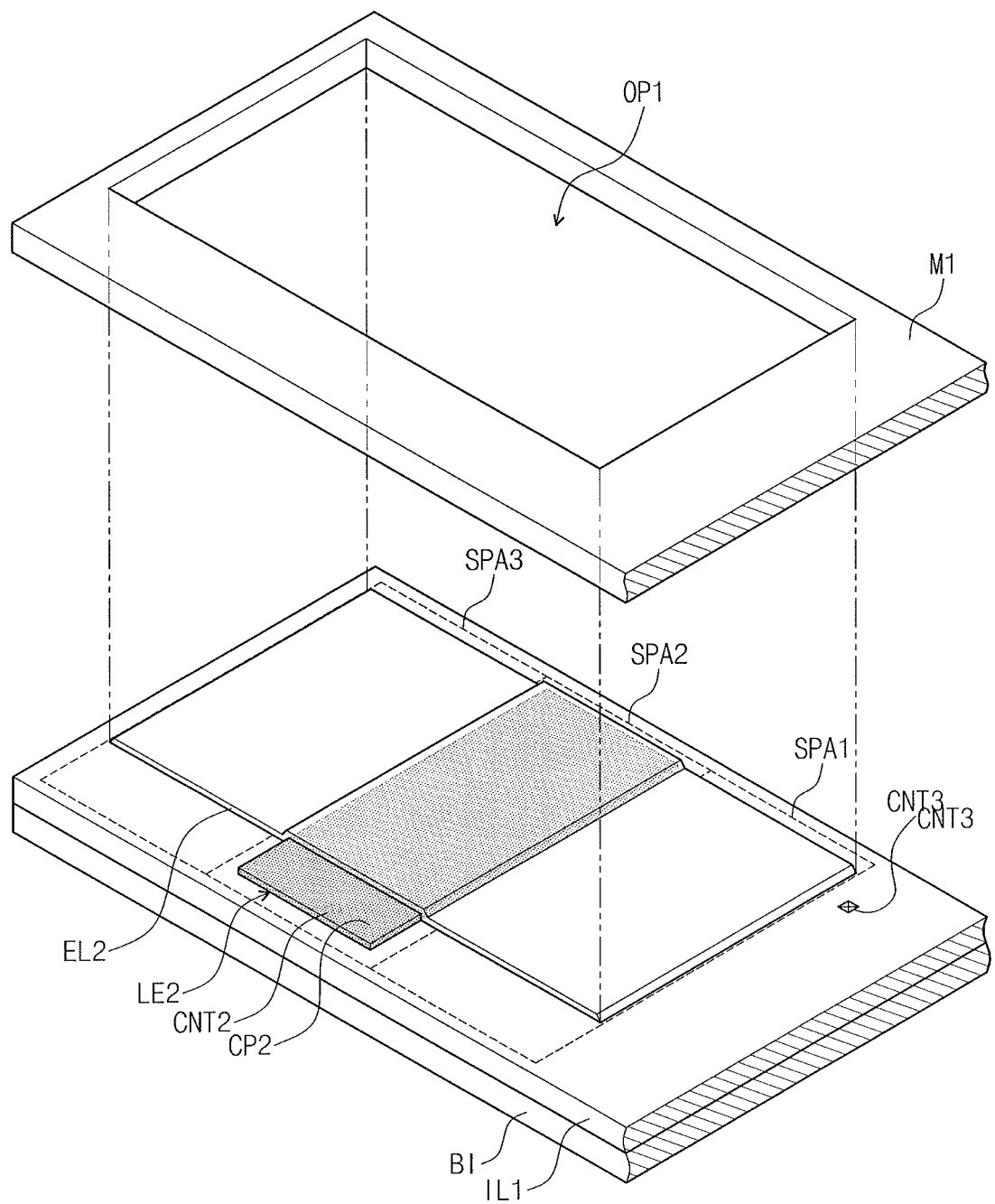

Then, referring to FIG. 9C, the second organic light emitting layer EL2 may be formed to correspond to the first to third sub-pixel areas SPA1 to SPA3. As an example, the second organic light emitting layer EL2 may be formed by the deposition process depositing the organic light emitting material using the first mask M1 as the same process as the first organic light emitting layer EL1. The second organic light emitting layer EL2 may overlap the second lower electrode LE2 in the second sub-pixel area SPA2. The first opening OP1 may not overlap the second connection portion CP2 of the second lower electrode LE2.

Figure 9D:
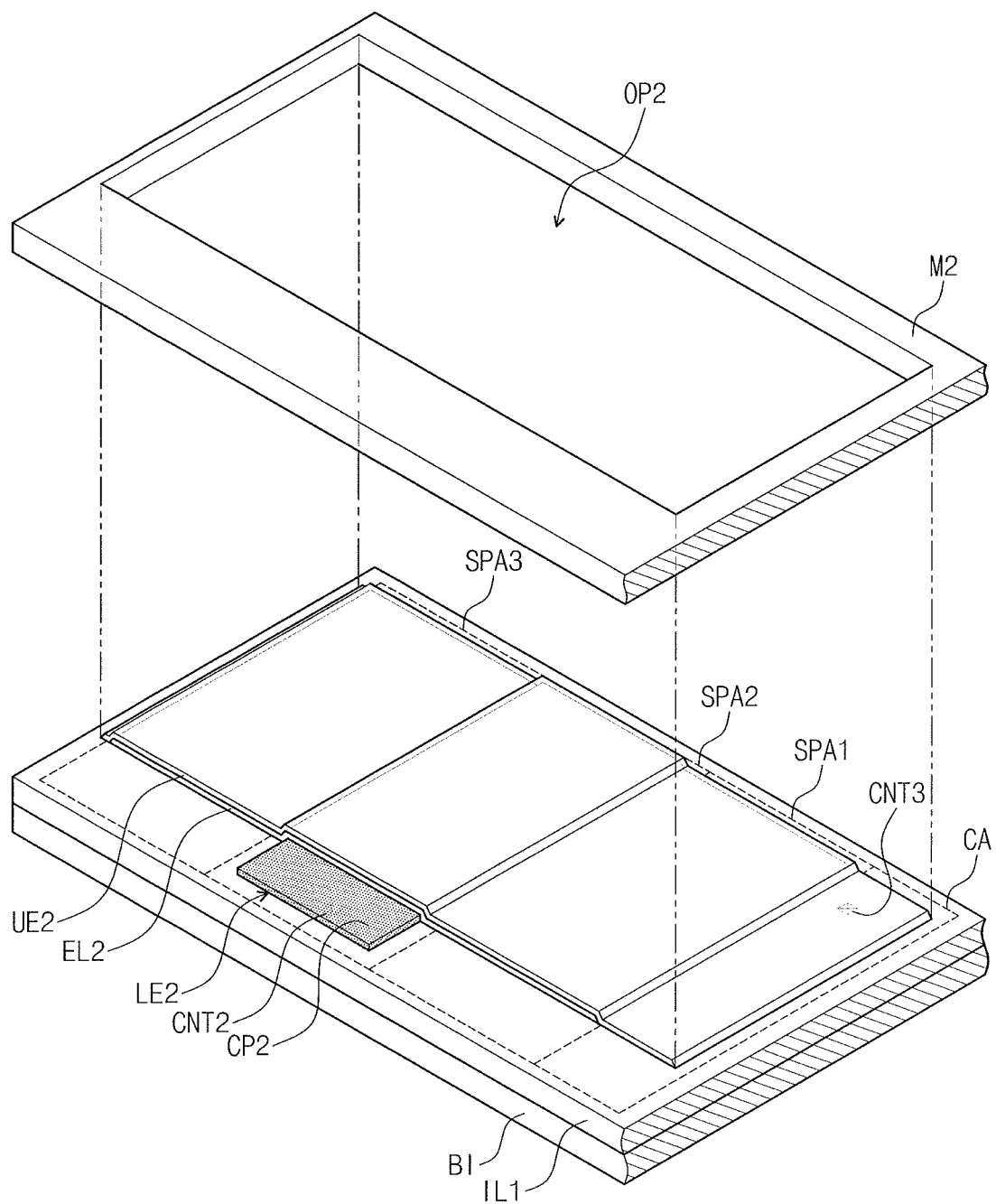

Referring to FIG. 9D, the second upper electrode UE2 may be formed to correspond to the first to third sub-pixel areas SPA1 to SPA3. As an example, the second upper electrode UE2 may be formed by the deposition process depositing the electrode material using the second mask M2 as the same process as the first upper electrode UE1. The second opening OP2 may not overlap the second connection portion CP2 of the second lower electrode LE2.

Figure 9E:
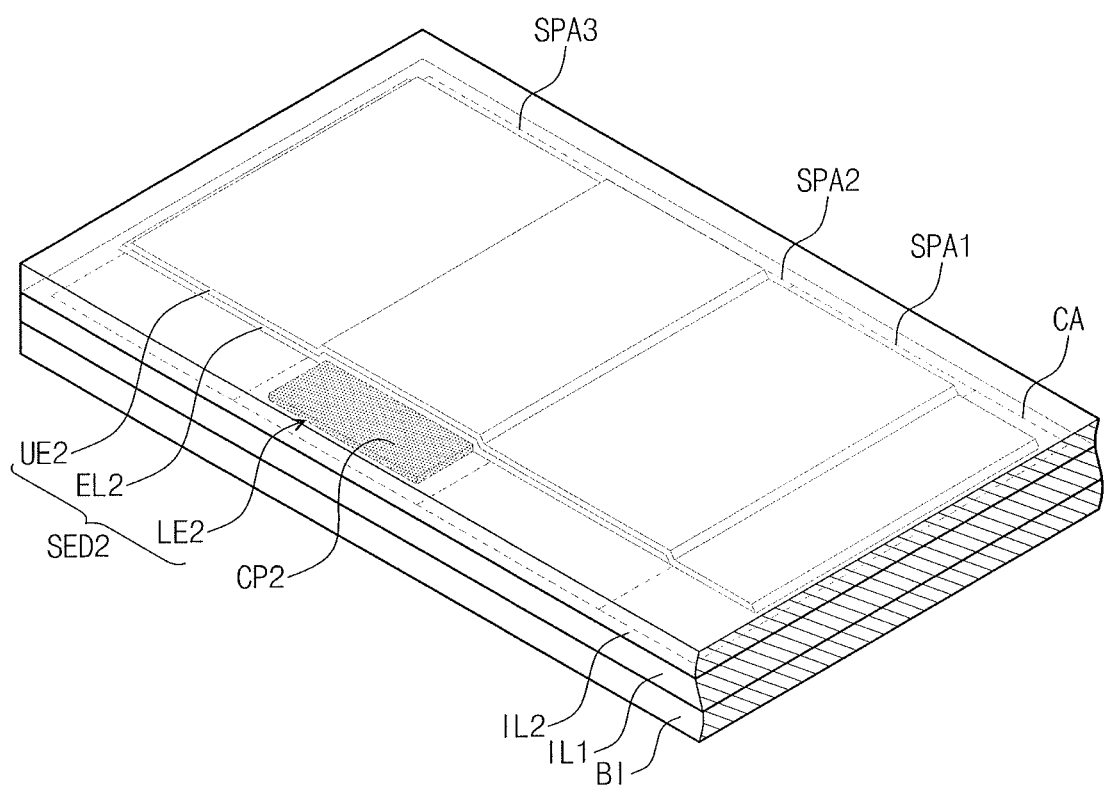

Referring to FIG. 9E, the second insulating layer IL2 may be formed on the entire surface of the first insulating layer IL1 and may cover the second sub-organic light emitting device SED2.

FIGS. 10A to 10E illustrate perspective views showing stages in a method of manufacturing the third sub-organic light emitting device according to an exemplary embodiment of the present disclosure.

Figure 10A:
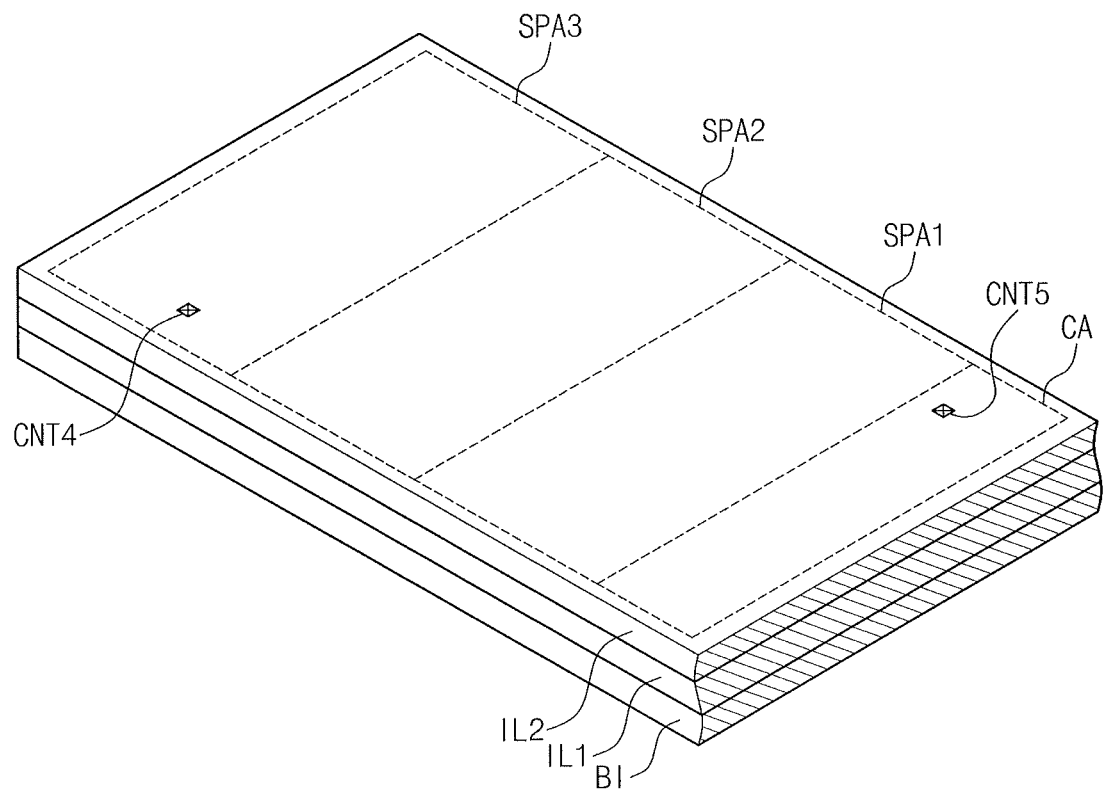
FIGS. 10A to 10E illustrate perspective views showing stages in a method of manufacturing a third sub-organic light emitting device according to an exemplary embodiment of the present disclosure.
Figure 10B:
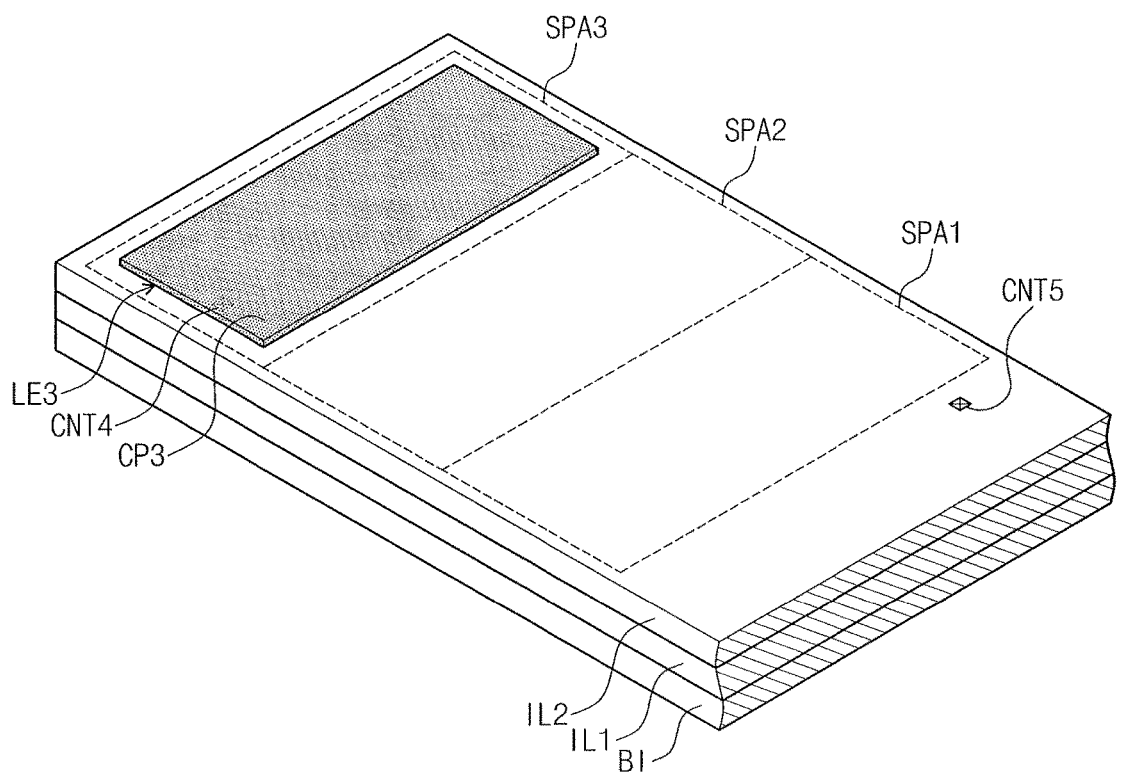

Referring to FIG. 10A, the fourth contact hole CNT4 may be formed through the base insulating layer BI, the first insulating layer IL1, and the second insulating layer IL2 in the third sub-pixel area SPA3. In addition, the fourth contact hole CNT5 may be formed through the second insulating layer IL2 in the upper electrode contact hole area CA. As shown in FIG. 10B, the third lower electrode LE3 may be formed to correspond to the third sub-pixel area SPA3. The third lower electrode LE3 may be formed through the similar process used to form the first and second lower electrodes LE1 and LE2.

Figure 10C:
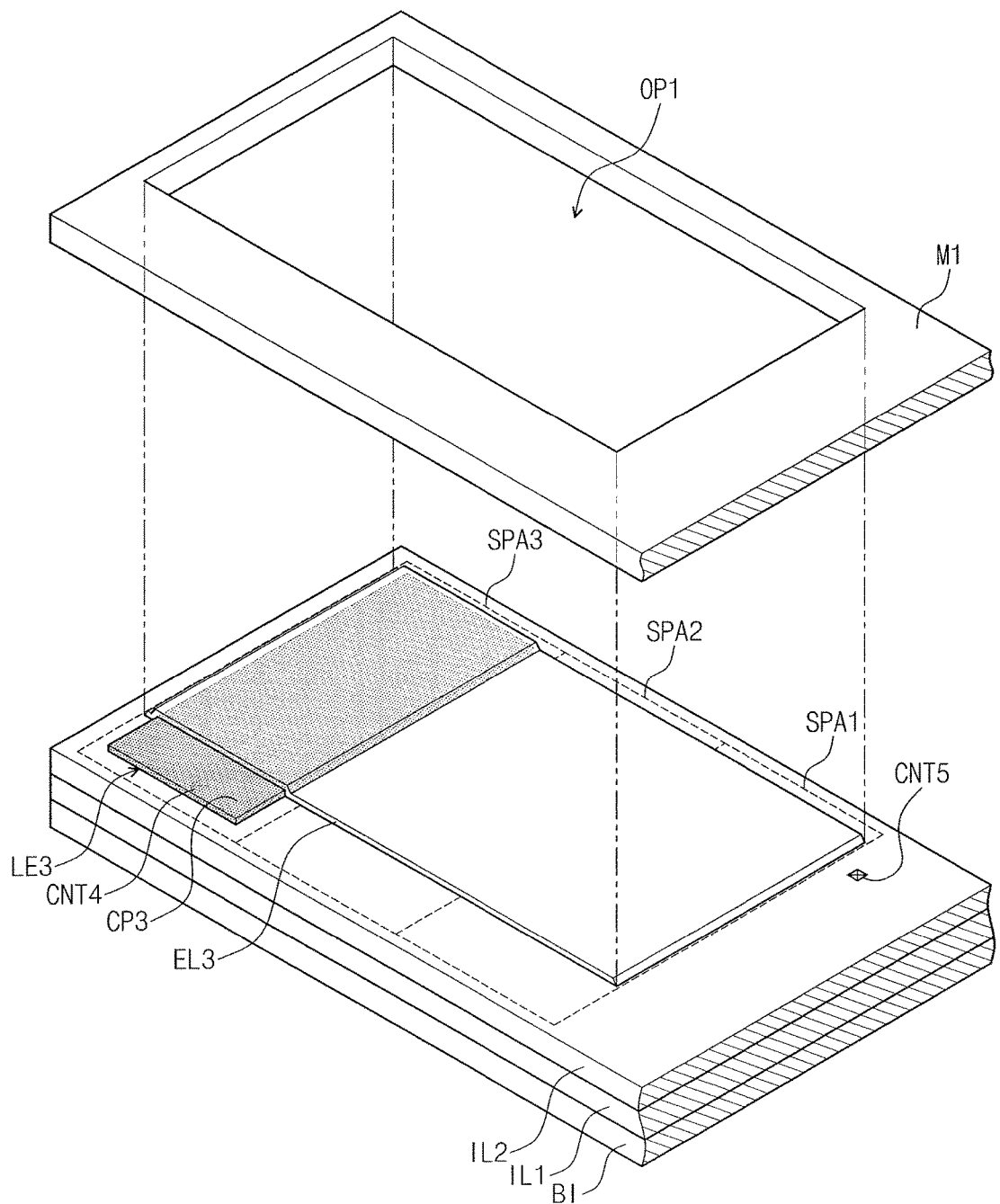

Then, referring to FIG. 10C, the third organic light emitting layer EL3 may be formed to correspond to the first to third sub-pixel areas SPA1 to SPA3. As an example, the third organic light emitting layer EL3 may be formed by the deposition process depositing the organic light emitting material using the first mask M1 as the same process as the first and second organic light emitting layers EL1 and EL2. The third organic light emitting layer EL3 may overlap the third lower electrode LE3 in the third sub-pixel area SPA3. The first opening OP1 may not overlap the third connection portion CP3 of the third lower electrode LE3.

Figure 10D:
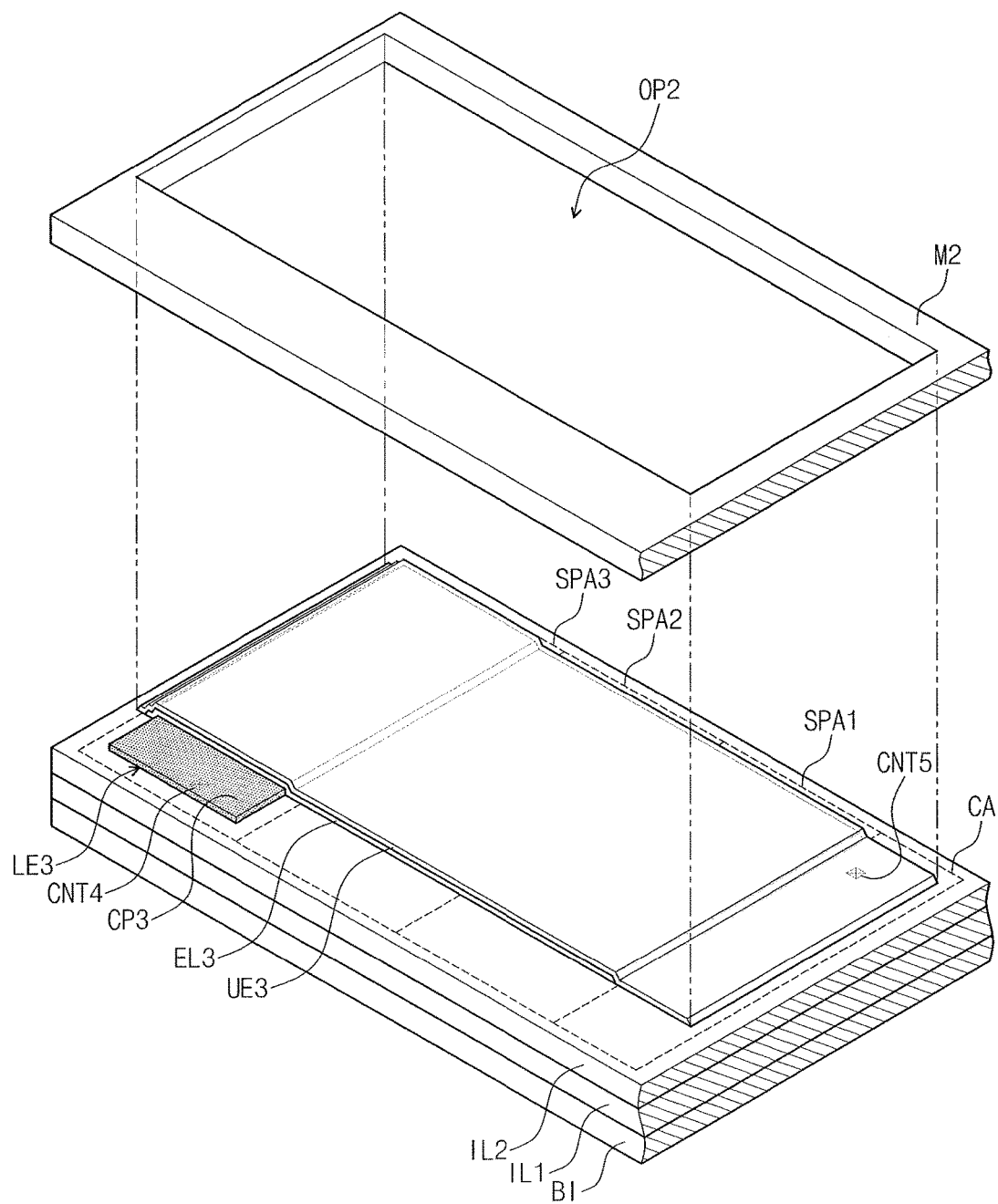

Referring to FIG. 10D, the third upper electrode UE3 may be formed to correspond to the first to third sub-pixel areas SPA1 to SPA3. As an example, the third upper electrode UE3 may be formed by the deposition process depositing the electrode material using the second mask M2 as the same process as the first upper electrode UE1. The third opening OP3 may not overlap the third connection portion of the third lower electrode LE3.

Figure 10E:
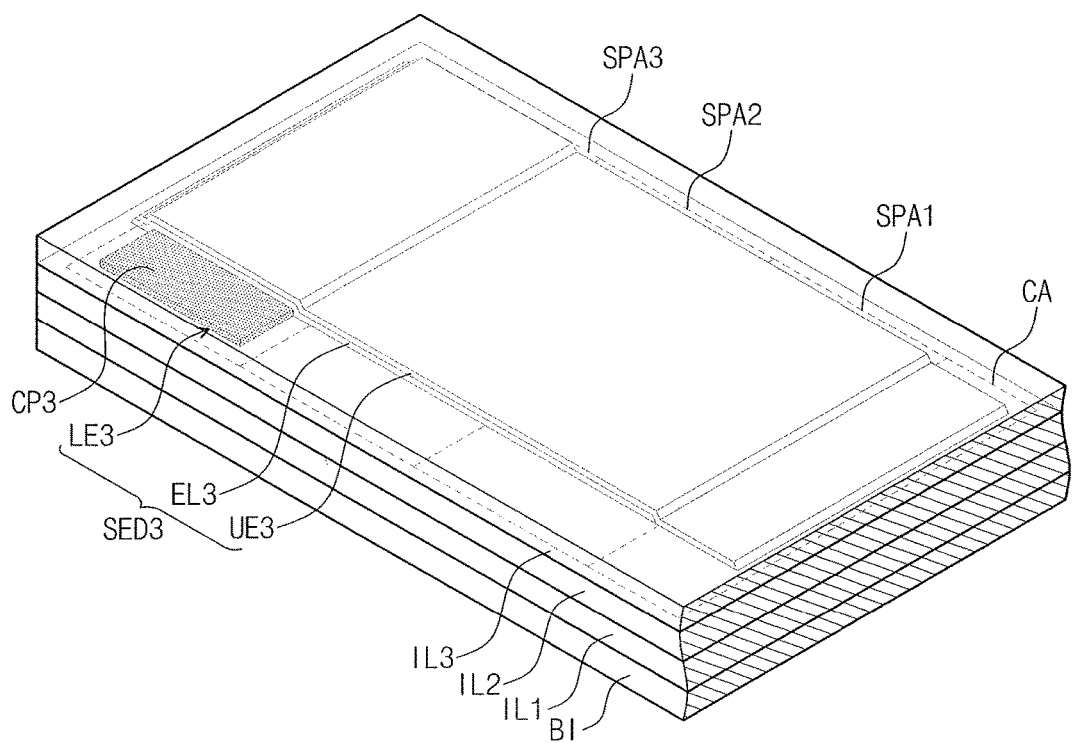

As shown in FIG. 10E, the third insulating layer IL3 may be formed on the entire surface of the second insulating layer 1L2 and may cover the third sub-organic light emitting device SED3.

To help reduce the possibility of and/or prevent the organic light emitting layers from being damaged during the manufacturing process, solvents used in the photolithography process applied to pattern the lower electrodes may not exert influence on or adversely affect the organic material. For instance, the photolithography process may be performed using a fluorine-based solution, such as carbon dioxide and hydrofluoroether (HFE) solvents, the organic material may not be influenced or adversely affected by the photolithography process. The photolithography process may use a negative photoresist, in which an exposed portion is not removed by the solvents, or a positive photoresist, in which the exposed portion is removed by the solvents.

In the present exemplary embodiment, the deposition process using the first mask has been described as a first process that forms the organic light emitting layers and the upper electrodes and the photolithography process has been described as a second process that forms the lower electrodes. In the present exemplary embodiment of the present disclosure, in the case where the minimum patterning distance of the first process is greater than the minimum patterning distance of the second process, as described above, the size of the sub-pixels may be effectively reduced and the resolution of the display panel DP (refer to FIG. 1) may be improved.

The embodiments may provide an organic light emitting device having improved resolution.

According to an embodiment, the organic light emitting layers may be stacked on one another and overlapped with the lower electrodes when viewed in a plan view. The organic light emitting layers may not be required to have the size corresponding to the size of the lower electrodes, and thus the size of the sub-pixels may be reduced and the resolution of the display device may be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light emitting device, comprising:
a first sub-organic light emitting device; and
a second sub-organic light emitting device on the first sub-organic light emitting device in a first direction, wherein:
the first sub-organic light emitting device includes a first lower electrode, a first organic light emitting layer on the first lower electrode, and a first upper electrode on the first organic light emitting layer, and
the second sub-organic light emitting device includes a second lower electrode insulated from the first lower electrode, a second organic light emitting layer on the second lower electrode and entirely overlapped with the first organic light emitting layer in the first direction, and a second upper electrode on the second organic light emitting layer.

2. The organic light emitting device as claimed in claim 1, wherein the second lower electrode is spaced apart from the first lower electrode when viewed in a plan view.

3. The organic light emitting device as claimed in claim 1, further comprising an insulating layer between the first and second sub-organic light emitting devices.

4. The organic light emitting device as claimed in claim 3, wherein the second upper electrode is electrically connected to the first upper electrode.

5. The organic light emitting device as claimed in claim 4, wherein the second upper electrode is electrically connected to the first upper electrode through a contact hole in the insulating layer.

6. The organic light emitting device as claimed in claim 5, wherein the first upper electrode is entirely overlapped with the second upper electrode in the first direction.

7. The organic light emitting device as claimed in claim 5, wherein the contact hole is spaced apart from the first and second organic light emitting layers when viewed in a plan view.

8. The organic light emitting device as claimed in claim 3, wherein the insulating layer includes an upper surface that is substantially flat.

9. The organic light emitting device as claimed in claim 1, wherein:
the first upper electrode overlaps the first lower electrode in a first light emitting area in the first direction,
the second upper electrode overlaps the second lower electrode in a second light emitting area in the first direction, and
the first light emitting area is spaced apart from the second light emitting area when viewed in a plan view.

10. The organic light emitting device as claimed in claim 1, wherein:
a distance between the first lower electrode and the second upper electrode is a first resonance distance, and
the first resonance distance is a resonance distance of a light generated by the first organic light emitting layer.

11. The organic light emitting device as claimed in claim 10, wherein:
a distance between the second lower electrode and the second upper electrode is a second resonance distance, and
the second resonance distance is a resonance distance of a light generated by the second organic light emitting layer.

12. The organic light emitting device as claimed in claim 1, further comprising a third sub-organic light emitting device on the second sub-organic light emitting device, wherein the third sub-organic light emitting device includes:
a third lower electrode that is insulated from the first lower electrode and the second lower electrode,
a third organic light emitting layer on the third lower electrode and entirely overlapped with the second organic light emitting layer in the first direction, and
a third upper electrode on the third organic light emitting layer.

13. The organic light emitting device as claimed in claim 1, wherein the first lower electrode and the second lower electrode are entirely overlapped with the first organic light emitting layer in the first direction.

14. The organic light emitting device as claimed in claim 13, wherein the first lower electrode and the second lower electrode are each a transparent electrode.

15. The organic light emitting device as claimed in claim 14, further comprising a reflective layer between the first lower electrode and a base substrate, the reflective layer being overlapped with the first lower electrode in the first direction.

16. The organic light emitting device as claimed in claim 15, wherein:
the second upper electrode is a transparent electrode or a reflective electrode,
a distance between the second upper electrode and the reflective layer is a first resonance distance, and
the first resonance distance is a resonance distance of a light generated by the first organic light emitting layer or the second organic light emitting layer.

17. The organic light emitting device as claimed in claim 1, further comprising a third sub-organic light emitting device on a same layer as the first sub-organic light emitting device, wherein the third sub-organic light emitting device includes:
a third lower electrode insulated from the first lower electrode and the second lower electrode,
a third organic light emitting layer on the third lower electrode, and
a third upper electrode on the third organic light emitting layer.

18. The organic light emitting device as claimed in claim 1, wherein:
the first sub-organic light emitting device includes a third lower electrode on a same layer as the first lower electrode, and
the third lower electrode is spaced apart from the first lower electrode when viewed in a plan view.

19. A method of manufacturing a sub-organic light emitting device, the method comprising:
- forming a first lower electrode;
- depositing a first organic light emitting material using a first mask including a first opening therethrough such that a first organic light emitting layer is formed corresponding to a first area;
- forming an insulating layer that covers the first lower electrode and the first organic light emitting layer;
- forming a second lower electrode on the insulating layer; and
- depositing a second organic light emitting material on the second lower electrode in a first direction using the first mask to form a second organic light emitting layer that corresponds to the first area such that the second organic light emitting material is entirely overlapped with the first organic light emitting material in the first direction.

20. The method as claimed in claim 19, wherein forming the first lower electrode and forming the second lower electrode each include a patterning process performed by photolithography.

21. The method as claimed in claim 19, wherein forming the insulating layer includes depositing an organic thin layer or an inorganic thin layer.

22. The method as claimed in claim 19, further comprising:
- depositing a first electrode material using a second mask that includes a second opening therethrough to form a first upper electrode on the first organic light emitting layer; and
- depositing a second electrode material using the second mask to form a second upper electrode on the second organic light emitting layer.

* * * * *